United States Patent
Kunimoto et al.

(10) Patent No.: US 9,198,290 B2
(45) Date of Patent: Nov. 24, 2015

(54) WIRING SUBSTRATE, METHOD OF MANUFACTURING THE SAME, AND SEMICONDUCTOR DEVICE

(71) Applicant: Shinko Electric Industries Co., Ltd., Nagano-shi, Nagano (JP)

(72) Inventors: Yuji Kunimoto, Nagano (JP); Naoyuki Koizumi, Nagano (JP)

(73) Assignee: SHINKO ELECTRIC INDUSTRIES CO., LTD., Nagano-shi, Nagano (JP)

( * ) Notice: Subject to any disclaimer, the term of this patent is extended or adjusted under 35 U.S.C. 154(b) by 0 days.

(21) Appl. No.: 14/527,079

(22) Filed: Oct. 29, 2014

(65) Prior Publication Data

US 2015/0048505 A1    Feb. 19, 2015

Related U.S. Application Data

(62) Division of application No. 13/603,882, filed on Sep. 5, 2012, now Pat. No. 8,907,489.

(30) Foreign Application Priority Data

Sep. 15, 2011 (JP) .................................. 2011-201707

(51) Int. Cl.
*H01L 23/52* (2006.01)
*H01L 23/48* (2006.01)
(Continued)

(52) U.S. Cl.
CPC .......... *H05K 1/112* (2013.01); *H01L 23/49822* (2013.01); *H01L 23/49827* (2013.01);
(Continued)

(58) Field of Classification Search
CPC .................... H01L 23/49822; H01L 23/49827

USPC .................................................. 257/774, 758
See application file for complete search history.

(56) References Cited

U.S. PATENT DOCUMENTS 6,856,023 B2    2/2005    Muta et al.
6,921,977 B2    7/2005    Shimizu et al.
(Continued)

FOREIGN PATENT DOCUMENTS

JP    2001-044197 A    2/2001
JP    2002-170904 A    6/2002
(Continued)

OTHER PUBLICATIONS

Japanese Office Action issued Mar. 17, 2015 in counterpart Japanese Patent Application No. 2011-201707 (4 pages) with English Translation (5 pages).

*Primary Examiner* — Luan C Thai
(74) *Attorney, Agent, or Firm* — Drinker Biddle & Reath LLP

(57) ABSTRACT

A wiring substrate includes: a substrate layer made of glass or silicon and including: a first surface formed with a first hole; and a second surface formed with a second hole and being opposite to the first surface, wherein the first hole is communicated with the second hole; a connection pad formed in the second hole; a first wiring layer formed in the first hole and electrically connected to the connection pad; a first insulation layer formed on the first surface of the substrate layer to cover the first wiring layer; and a second wiring layer formed on the first insulation layer and electrically connected to the first wiring layer. A diameter of the first hole is gradually decreased from the first surface toward the second surface, and a diameter of the second hole is gradually decreased from the second surface toward the first surface.

8 Claims, 20 Drawing Sheets

(51) Int. Cl.
*H05K 1/11* (2006.01)
*H01L 23/00* (2006.01)
*H05K 1/02* (2006.01)
*H05K 1/03* (2006.01)
*H01L 23/498* (2006.01)
*H05K 3/46* (2006.01)

(52) U.S. Cl.
CPC .............. *H01L24/17* (2013.01); *H05K 1/0298* (2013.01); *H05K 1/0306* (2013.01); *H05K 1/0313* (2013.01); *H01L 23/49816* (2013.01); *H01L 2224/16113* (2013.01); *H01L 2224/16225* (2013.01); *H01L 2224/16227* (2013.01); *H01L 2224/16235* (2013.01); *H01L 2924/01029* (2013.01); *H01L 2924/01079* (2013.01); *H01L 2924/15311* (2013.01); *H01L 2924/15788* (2013.01); *H01L 2924/351* (2013.01); *H05K 3/4605* (2013.01); *H05K 2201/096* (2013.01); *H05K 2201/09563* (2013.01); *H05K 2203/025* (2013.01); *Y10T 29/49155* (2015.01)

(56) References Cited

U.S. PATENT DOCUMENTS

| 7,341,934 | B2 * | 3/2008 | Hsu et al. ...................... 438/613 |
| 7,511,518 | B2 * | 3/2009 | Egitto et al. ............. 324/754.18 |
| 7,521,799 | B2 | 4/2009 | Hayashi et al. |
| 2003/0160325 | A1 | 8/2003 | Yoneda et al. |
| 2004/0224499 | A1 | 11/2004 | Yoneda et al. |
| 2007/0145518 | A1 | 6/2007 | Mihara |
| 2009/0174062 | A1 | 7/2009 | Mihara |
| 2010/0264552 | A1 | 10/2010 | Nakasato et al. |

FOREIGN PATENT DOCUMENTS

| JP | 2003-249601 A | 9/2003 |
| JP | 2004-047667 A | 2/2004 |
| JP | 2004-111915 A | 4/2004 |
| JP | 2005-086071 A | 3/2005 |
| JP | 2006-147932 A | 6/2006 |
| JP | 2007-180351 A | 7/2007 |
| JP | 2009-088169 A | 4/2009 |
| JP | 2010-166095 A | 7/2010 |

\* cited by examiner

WIRING SUBSTRATE, METHOD OF MANUFACTURING THE SAME, AND SEMICONDUCTOR DEVICE

CROSS-REFERENCE TO RELATED APPLICATIONS

This application is a divisional application of U.S. application Ser. No. 13/603,882, filed Sep. 5, 2012, which claims priority from Japanese Patent Application No. 2011-201707, filed on Sep. 15, 2011, the entire contents of which are herein incorporated by reference.

BACKGROUND

1. Technical Field

Embodiment described herein relate to a wiring substrate, a method of manufacturing the wiring substrate, and a semiconductor device.

2. Related Art

In the past, there has been a wiring substrate on which a semiconductor chip and the like are mounted. In an example of such a wiring substrate, multilayered build-up wiring is formed on both surfaces of a core substrate including through electrodes. Further, solder bumps of a semiconductor chip are flip-chip connected to connection pads, which are formed on one surface of the wiring substrate, by reflow heating (see e.g., JP-A-2004-47667 and JP-A-2005-86071).

As described in the section of preliminary content to be described below, the coefficient of thermal expansion of a wiring substrate where build-up wiring layers are formed on both surfaces of a core substrate is considerably larger than that of a semiconductor chip (silicon) to be mounted. Accordingly, the wiring substrate is apt to expand or warp more than the semiconductor chip due to the reflow heating that is performed when the semiconductor chip is mounted.

For this reason, particularly, if connection bumps of the semiconductor chip narrow, the connection pads of the wiring substrate are disposed to be shifted from the connection bumps of the semiconductor chip when the semiconductor chip is mounted. Accordingly, it is difficult to reliably mount the semiconductor chip.

SUMMARY OF THE INVENTION

An illustrative aspect of the present invention is to provide a wiring substrate on which even a semiconductor chip including narrow connection bumps can be reliably mounted, a method of manufacturing the wiring substrate, and a semiconductor device.

According to one or more illustrative aspects of the present invention, there is provided a wiring substrate. The wiring substrate comprises: a substrate layer made of glass or silicon and comprising: a first surface formed with a first hole; and a second surface formed with a second hole and being opposite to the first surface, wherein the first hole is communicated with the second hole; a connection pad formed in the second hole; a first wiring layer formed in the first hole and electrically connected to the connection pad; a first insulation layer formed on the first surface of the substrate layer to cover the first wiring layer; and a second wiring layer formed on the first insulation layer and electrically connected to the first wiring layer. A diameter of the first hole is gradually decreased from the first surface toward the second surface, and a diameter of the second hole is gradually decreased from the second surface toward the first surface.

According to one or more illustrative aspects of the present invention, there is provided a wiring substrate. The wiring substrate comprises: a substrate layer made of glass or silicon and comprising: a first surface and a second surface opposite to the first surface, wherein the substrate layer is formed with a through hole whose diameter is gradually decreased from the first surface to the second surface; a connection pad formed on the second surface of the substrate layer; a first wiring layer formed in the through hole and electrically connected to the connection pad; a first insulation layer formed on the first surface of the substrate layer to cover the first wiring layer; and a second wiring layer formed on the first insulation layer and electrically connected to the first wiring layer.

According to one or more illustrative aspects of the present invention, there is provided a semiconductor device. The semiconductor device comprises: a wiring substrate comprising: a substrate layer made of glass or silicon and comprising: a first surface formed with a first hole; and a second surface formed with a second hole and being opposite to the first surface, wherein the first hole is communicated with the second hole; a connection pad formed in the second hole; a first wiring layer formed in the first hole and electrically connected to the connection pad; a first insulation layer formed on the first surface of the substrate layer to cover the first wiring layer; and a second wiring layer formed on the first insulation layer and electrically connected to the first wiring layer, wherein a diameter of the first hole is gradually decreased from the first surface toward the second surface, and a diameter of the second hole is gradually decreased from the second surface toward the first surface; and a semiconductor chip mounted on the wiring substrate so as to be connected to the connection pad.

According to one or more illustrative aspects of the present invention, there is provided a method of manufacturing a wiring substrate. The method comprises: (a) providing a substrate made of glass or silicon and comprising a first surface and a second surface opposite to the first surface; (b) forming a first hole in a first surface of the substrate so as not to pass through the substrate; (c) forming a first wiring layer on the first surface of the substrate and in the first hole; (d) forming an insulation layer on the first surface of the substrate to cover the first wiring layer; (e) forming a second wiring layer on the insulation layer to electrically connect the first wiring layer; (f) reducing a thickness of the substrate from the second surface of the substrate such that the first wiring layer is still covered by the substrate; (g) forming a second hole in the second surface of the substrate such that the second hole is communicated with the first hole and the first wiring layer is exposed from the second hole; and (h) forming a connection pad in the second hole such that the connection pad is electrically connected to the first wiring layer, wherein the first hole is formed in the first surface of the substrate such that a diameter of the first hole is gradually decreased from the first surface toward the second surface, and the second hole is formed in the second surface of the substrate such that a diameter of the second hole is gradually decreased from the second surface toward the first surface.

According to one or more illustrative aspects of the present invention, there is provided a method of manufacturing a wiring substrate. The method comprises: (a) providing a substrate made of glass or silicon and comprising a first surface and a second surface opposite to the first surface; (b) forming a hole in a first surface of the substrate so as not to pass through the substrate; (c) forming a first wiring layer on the first surface of the substrate and in the hole; (d) forming an insulation layer on the first surface of the substrate to cover the first wiring layer; (e) forming a second wiring layer on the insulation layer to electrically connect the first wiring layer; (f) reducing a thickness of the substrate from the second surface of the substrate such that the first wiring layer formed in the hole is exposed from the second surface; and (g) forming a connection pad on the second surface of the substrate such that the connection pad is electrically connected to the first wiring layer.

Other aspects and advantages of the present invention will be apparent from the following description, the drawings and the claims.

DETAILED DESCRIPTION OF EXEMPLARY EMBODIMENTS

Exemplary embodiments will be described below with reference to the accompanying drawings.

Figure 1:
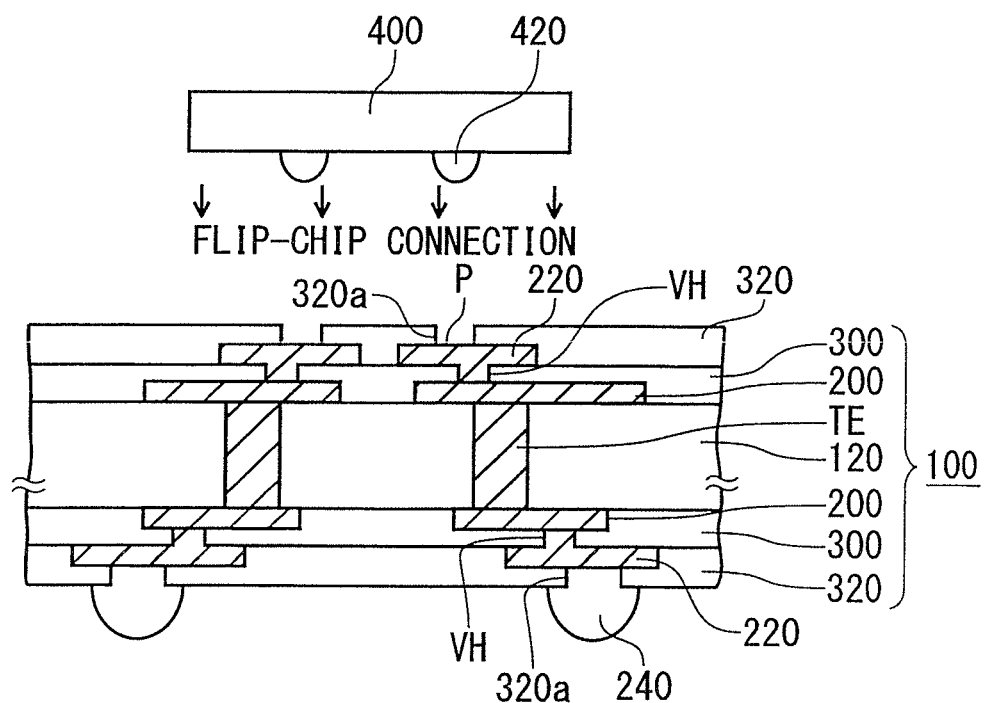
FIG. 1 is a cross-sectional view illustrating preliminary content.

Preliminary content as a base will be described prior to the description of the embodiments. FIG. 1 is a cross-sectional view illustrating preliminary content.

As shown in FIG. 1, a core substrate 120 made of a glass epoxy resin or the like is disposed at the middle portion of a wiring substrate 100 according to the preliminary content in a thickness direction of the wiring substrate. Through electrodes TE, which pass through the core substrate 120 in the thickness direction of the core substrate, are formed in the core substrate 120.

First wiring layers 200, which are connected to each other by the through electrodes TE, are formed on both surfaces of the core substrate 120. Further, interlayer insulation layers 300 in which via holes VH reaching the first wiring layers 200 are formed are formed on both surfaces of the core substrate 120.

Second wiring layers 220, which are connected to the first wiring layers 200 through the via holes VH, are formed on the interlayer insulation layers 300 that are formed on both surfaces of the core substrate 120.

In addition, a solder resist 320, where opening portions 320a are formed on connection pads P of the second wiring layer 220, is formed on the upper interlayer insulation layer 300. Further, the solder resist 320, where opening portions 320a are formed on connection portions of the second wiring layer 220, is formed on the lower interlayer insulation layer 300. External connection terminals 240 are connected to the lower second wiring layer 220.

Furthermore, solder bumps 420 of a semiconductor chip 400 are flip-chip connected to the connection pads P, which are formed on the upper surface of the wiring substrate 100, by reflow heating. The coefficient of thermal expansion of the wiring substrate 100 (interlayer insulation layers (resin)/wiring layers (copper) and the like) is larger than that of the semiconductor chip 400 (silicon).

For this reason, the wiring substrate 100 expands or warps more than the semiconductor chip 400 due to the heating that is performed for the flip-chip connection between the semiconductor chip 400 and the wiring substrate 100. As a result, the positions of the connection pads P are shifted.

In particular, if the pitch of the solder bumps 420 of the semiconductor chip 400 is reduced to 100 μm or less, the connection pads P of the wiring substrate 100 are disposed to be shifted from the solder bumps 420 of the semiconductor chip 400. Accordingly, it is difficult to reliably mount the semiconductor chip 400.

Further, the second wiring layers 220 (connection pads P) are formed on the interlayer insulation layers 300 (resin) by a semi-additive method. In detail, after seed layers (not shown) are formed on the interlayer insulation layers 300 first, plating resists (not shown) including opening portions formed at portions where the second wiring layers 220 are to be disposed are formed.

After that, metal plating layers are formed by electrolytic plating where the seed layers are used as plating power-supply paths. Furthermore, after the plating resists are removed, the seed layers are etched while the metal plating layers are used as masks.

Since relatively large irregularities are formed on the surfaces of the interlayer insulation layers 300 (resin), considerable over-etching is needed so that residues are not formed during the etching of the seed layers. For this reason, undercut occurs on the seed layers and the patterns of the metal plating layers are apt to become thin.

Accordingly, when the "line:space" of the second wiring layers 220 (connection pads P) particularly becomes "10:10 μm" or less, the width of a finished line becomes considerably small and deviates from design specifications. Eventually, the width of the line becomes small, so that the adhesion between the wiring layer and the interlayer insulation layer is reduced and the second wiring layers 220 are partially detached from the surfaces of the interlayer insulation layers 300.

As described above, it is difficult to form a wiring layer, of which the "line:space" is "10:10 μm" or less, on a resin layer, which has irregularities, with high yield by a semi-additive method.

When it is difficult to reduce the pitch of the wiring layer, it is necessary to cope with this by increasing the number of build-up wiring layers to be laminated. For this reason, the thickness of the wiring substrate is increased, so that it is difficult to cope with the demand for the reduction in size and thickness.

Further, for the suppression of warpage of the whole core layer 120 of the wiring substrate 100, the thickness of the core layer 120 of the wiring substrate 100 is set to be relatively large, that is, in the range of 400 to 800 μm. Furthermore, the diameter of each of the through electrodes TE passing through the core layer 120 is set to about 200 μm.

As described above, the through electrodes TE, which are considerably thicker and longer than the first and second wiring layers 200 and 220 or the via holes VH (via conductors), formed in the core layer 120. For this reason, since signals are apt to be reflected by the through electrodes TE on high-frequency signal transmission lines of the wiring substrate 100, there is a concern about the degradation of high-frequency characteristics.

It is possible to solve the above-mentioned problems by using wiring substrates according to embodiments to be described below.

First Embodiment

Figure 4A:
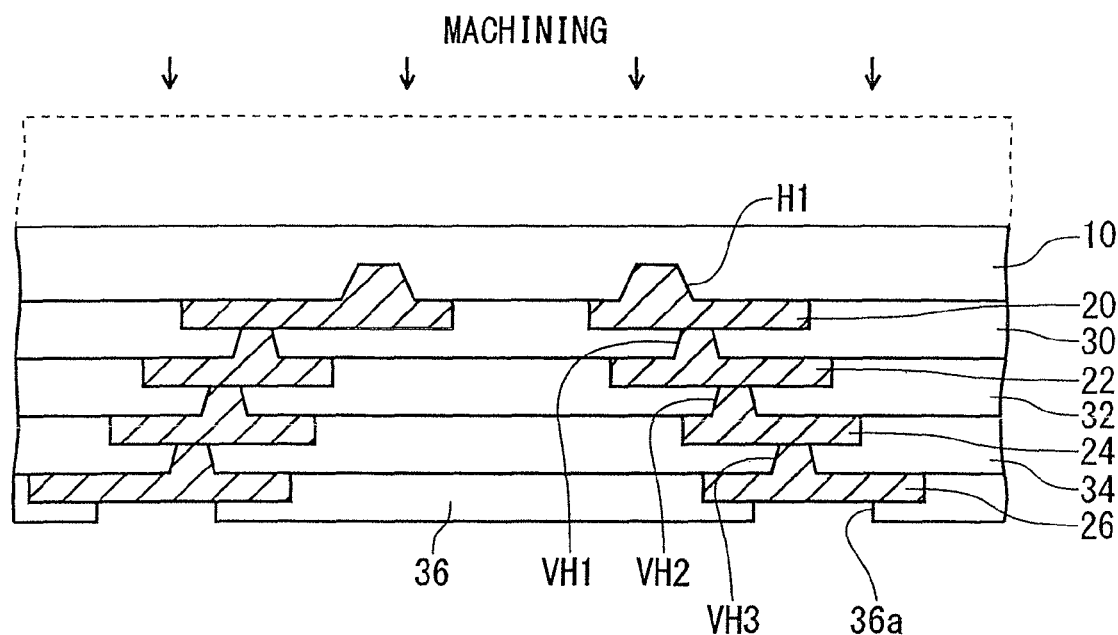
FIGS. 4A and 4B are (third) cross-sectional views illustrating the method of manufacturing the wiring substrate according to the first embodiment.
Figure 4B:
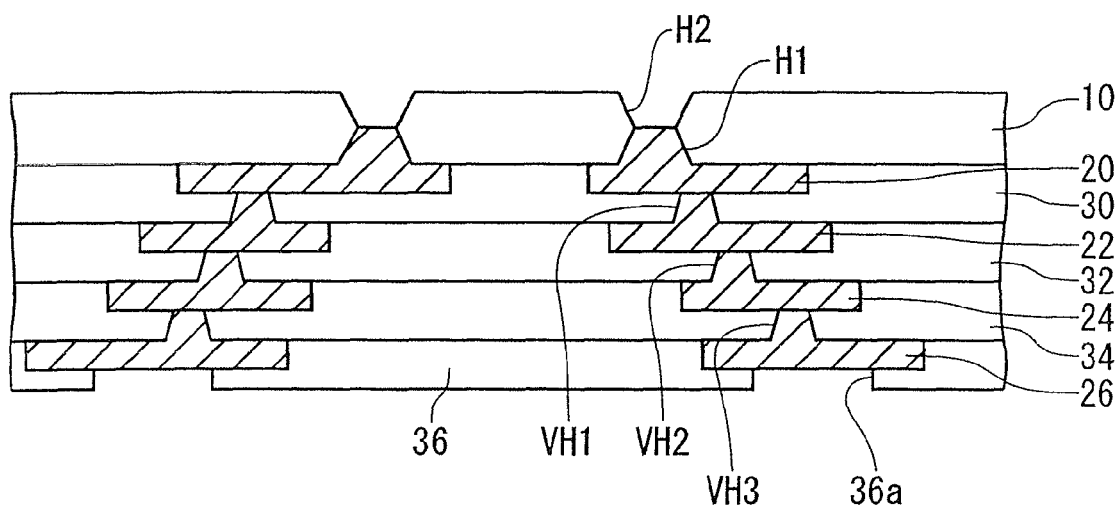
Figure 5:
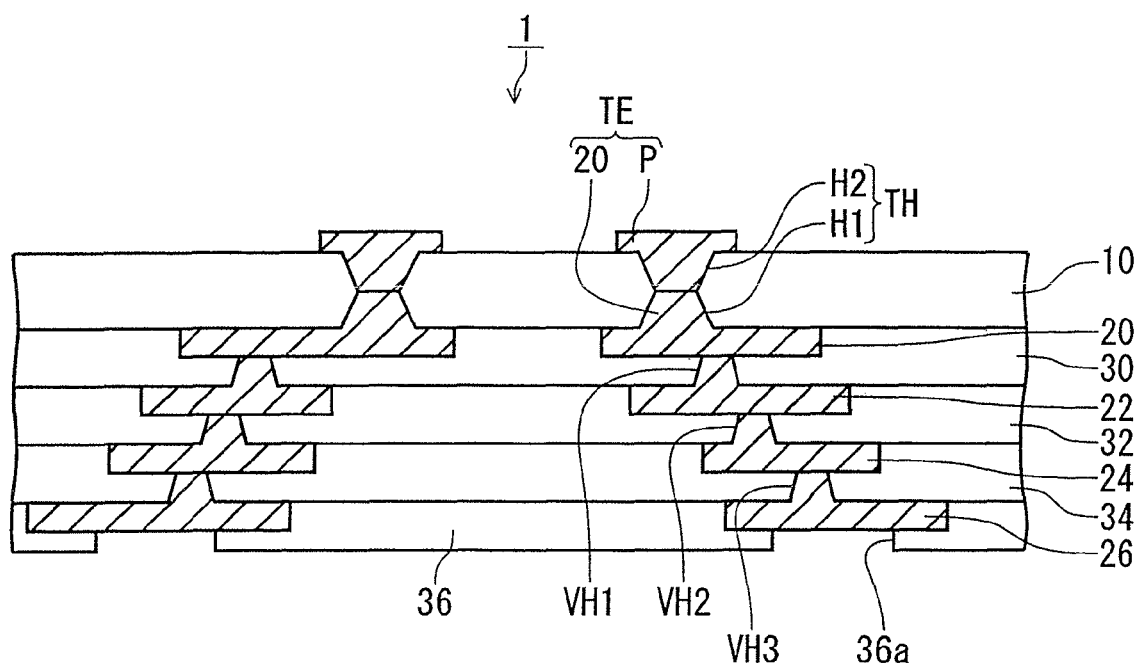
FIG. 5 is a cross-sectional view of the wiring substrate according to the first embodiment.

FIGS. 2 to 4 are cross-sectional views illustrating a method of manufacturing a wiring substrate according to a first embodiment, and FIG. 5 is a cross-sectional view of the wiring substrate according to the first embodiment.

Figure 2A:
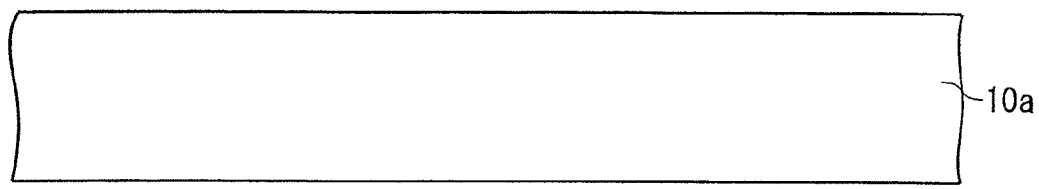
FIGS. 2A to 2C are (first) cross-sectional views illustrating a method of manufacturing a wiring substrate according to a first embodiment.

In the method of manufacturing the wiring substrate according to the first embodiment, a glass substrate 10a having a thickness of 0.3 to 1 mm is prepared first as shown in FIG. 2A. Aluminoborosilicate glass, such as E-glass or T-glass, is used as an example of the glass substrate 10a. T-glass is glass of which component ratios of $SiO_2$ and $Al_2O_3$ are higher than those of E-glass.

Figure 2B:
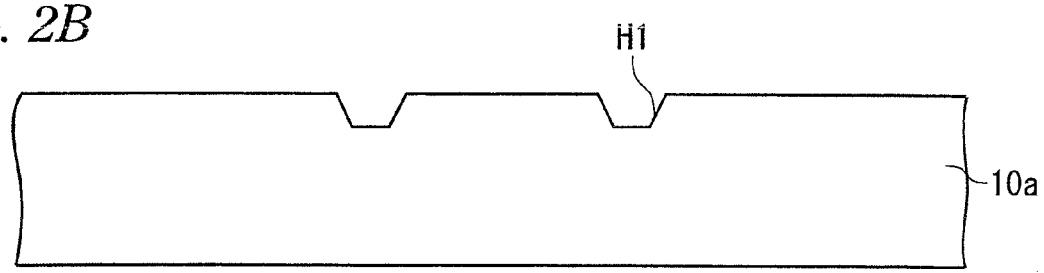

After that, first holes H1 are formed from the upper surface of the glass substrate 10a so as not to pass through the glass substrate 10a as shown in FIG. 2B. The first holes H1 are formed by laser, a drill, a blast method, etching, or the like.

For example, the diameter of an opening end of the first hole H1, which is opened to the surface of the glass substrate 10a, is about 50 μm and the depth of the first hole H1 is about 100 μm. Further, the cross-sectional shape of the first hole H1 is a tapered shape where the diameter of an upper portion is larger than that of a bottom.

Figure 2C:
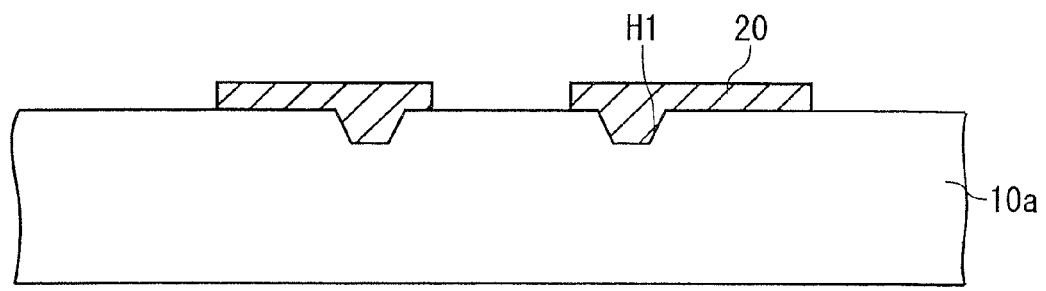

After that, as shown in FIG. 2C, a first wiring layer 20 is formed on the upper surface of the glass substrate 10a including the first holes H1. The first wiring layer 20 is formed so as to fill the first holes H1.

The first wiring layer 20 is formed by, for example, a semi-additive method. In detail, first, a seed layer (not shown) made of copper or the like is formed on the upper surface of the glass substrate 10a and the inner surfaces of the first holes H1 by electroless plating or a sputtering method. Then, a plating resist (not shown), which includes opening portions at a portion where the first wiring layer 20 is disposed, is formed.

In addition, a metal plating layer made of copper or the like is formed at the opening portions of the plating resist by electrolytic plating where the seed layer is used as a plating power-supply path. At this time, the first holes H1 of the glass substrate 10a are filled with the metal plating layer.

After that, after the plating resist is removed, the seed layer is etched while the metal plating layer is used as a mask. Accordingly, the seed layer and the metal plating layer form the first wiring layer 20.

Figure 3A:
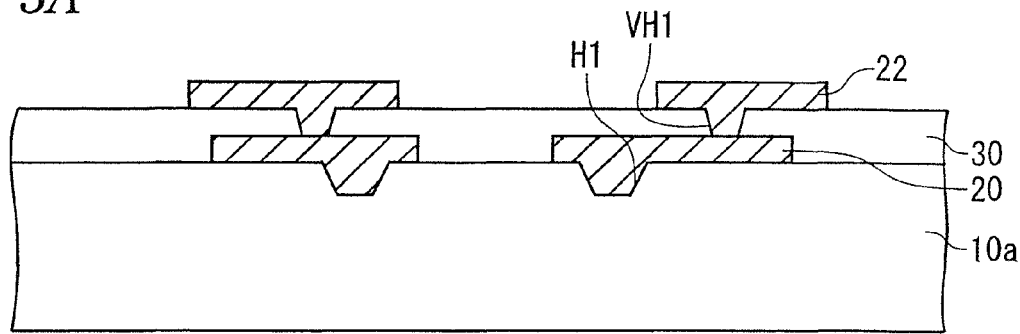
FIGS. 3A to 3C are (second) cross-sectional views illustrating the method of manufacturing the wiring substrate according to the first embodiment.

Subsequently, a first interlayer insulation layer 30, which covers the first wiring layer 20, is formed on the glass substrate 10a as shown in FIG. 3A. The first interlayer insulation layer 30 is obtained by attaching a resin film, which is made of a thermosetting epoxy resin, a thermosetting polyimide resin or the like, and heating and pressing the resin film with a vacuum press or the like.

Alternatively, in order to obtain the first interlayer insulation layer 30, liquid thermosetting resin, such as epoxy or polyimide, may be applied and cured by heating.

Moreover, first via holes VH1 reaching the first wiring layer 20 are formed by laser machining that is performed on the first interlayer insulation layer 30. Alternatively, the first interlayer insulation layer 30 may be made of a photosensitive resin and the first via holes VH1 may be formed by photolithography.

After that, as likewise shown in FIG. 3A, a second wiring layer 22, which is connected to the first wiring layer 20 through the first via holes VH1 (via conductors), is formed on the first interlayer insulation layer 30 by the same method as the method of forming the first wiring layer 20.

Figure 3B:
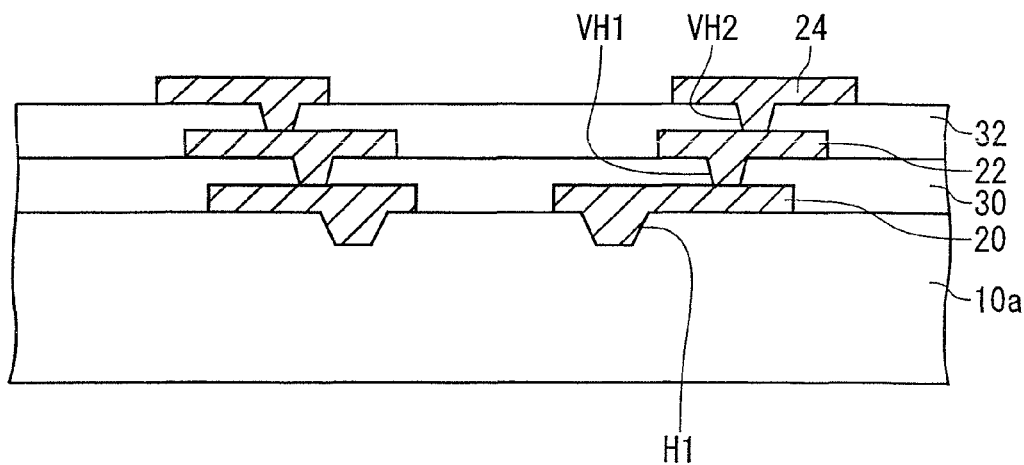

After that, as shown in FIG. 3B, a second interlayer insulation layer 32 in which second via holes VH2 reaching the second wiring layer 22 are formed is formed on the first interlayer insulation layer 30 by the same method as the method of forming the first interlayer insulation layer 30.

In addition, as likewise shown in FIG. 3B, a third wiring layer 24, which is connected to the second wiring layer 22 through the second via holes VH2 (via conductors), is formed on the second interlayer insulation layer 32 through the repetition of the same machining as described above.

Figure 3C:
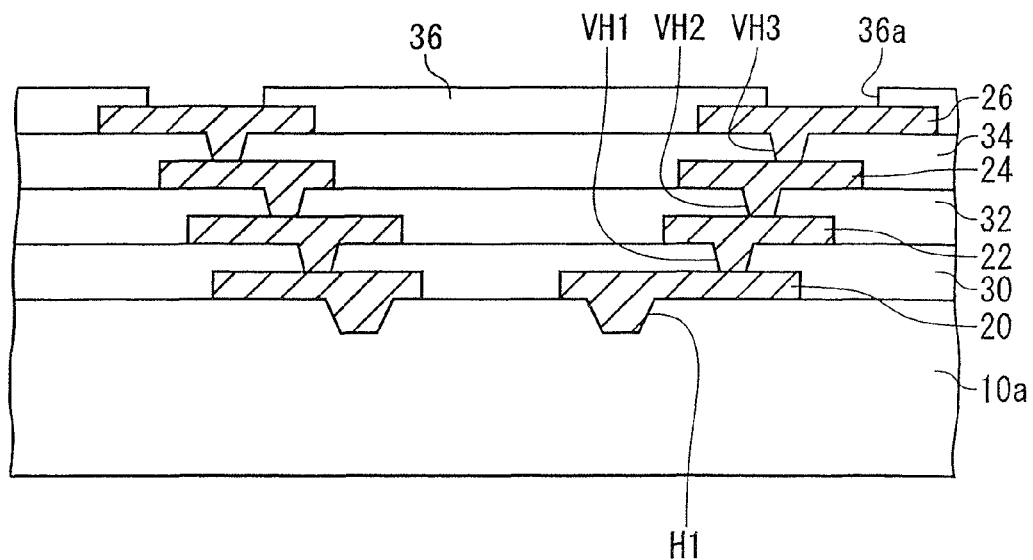

Subsequently, as shown in FIG. 3C, a third interlayer insulation layer 34 in which third via holes VH3 reaching the third wiring layer 24 are formed is formed on the second interlayer insulation layer 32 through the repetition of the same machining as described above.

In addition, as likewise shown in FIG. 3C, a fourth wiring layer 26, which is connected to the third wiring layer 24 through the third via holes VH3 (via conductors), is formed on the third interlayer insulation layer 34 through the repetition of the same machining as described above.

Then, a solder resist 36, where opening portions 36a are formed on connection portions of the fourth wiring layer 26, is formed. After that, a contact layer is formed by sequentially forming a nickel plating layer and a gold plating layer on the connection portions of the fourth wiring layer 26 from below as necessary.

Since the glass substrate 10a has sufficient rigidity, the glass substrate 10a functions as a support that prevents warpage in the steps of manufacturing the build-up wiring layers (the second to fourth wiring layers 22, 24, and 26).

Subsequently, as shown in FIG. 4A, a structure shown in FIG. 3C is turned over and the thickness of the entire structure is reduced by machining that is performed in the thickness direction on the surface of the glass substrate 10a opposite to the surface of the glass substrate 10a on which the first holes H1 are formed. Accordingly, a glass substrate layer 10 of which the thickness is reduced to the range of 100 to 300 μm is obtained.

Polishing such as CMP, dry etching, wet etching, blasting, or the like may be used as a method of machining the glass substrate 10a.

As described below, in this embodiment, through holes are formed by making the first holes H1, which are formed from one surface of the glass substrate layer 10, communicate with second holes that are formed from the other surface of the glass substrate layer 10. For this reason, the thickness of the glass substrate 10a is reduced so that the glass substrate layer 10 remains on the first wiring layer 20 in the first hole H1.

After that, as shown in FIG. 4B, second holes H2 reaching the first wiring layer 20 formed in the first holes H1 are formed by machining that is performed on portions of the glass substrate layer 10 formed on the first holes H1. In an example of FIG. 4B, the diameter of an opening end of the second hole H2, which is opened to the surface of the glass substrate layer 10, is set to about 50 μm and the depth of the second hole H2 is set to about 100 μm.

In the process shown in FIG. 4B, after forming the second hole H2, an exposed surface of the first wiring layer 20 formed in the first hole H1 is roughened by laser irradiation.

The cross-sectional shape of the second hole H2 is a tapered shape where the diameter of an upper portion is larger than that of a bottom. In this way, the first and second holes H1 and H2 are disposed symmetrically to a middle portion of the glass substrate layer 10 in the thickness direction of the glass substrate layer as the axis of symmetry.

Subsequently, as shown in FIG. 5, connection pads P, which are connected to the first wiring layer 20 so as to fill the second holes H2, are formed on the upper surface of the glass substrate layer 10 from the inside of the second holes H2. The connection pads P may be disposed so as to be isolated in the shape of an island, and may be disposed at end portions of lines that are formed so as to be led from the second holes H2 to the upper surface of the glass substrate layer 10.

The connection pads P are made of copper or the like, and a contact layer may be formed on the surfaces of the connection pads by sequentially forming a nickel plating layer and a gold plating layer from below as necessary.

The connection pads P are formed on the glass substrate layer 10, of which the surface is smooth, by a semi-additive method that has been described in the step of forming the first wiring layer 20. For this reason, when the seed layer is etched by a semi-additive method, it is possible to considerably reduce the amount of over-etching as compared to a case where a seed layer is formed on a resin layer having large irregularities. As a result, it is possible to form connection pads P that has a small pitch where the "line:space" is "10:10 μm" or less.

As described above, a wiring substrate 1 according to the first embodiment is obtained.

As shown in FIG. 5, in the wiring substrate 1 according to the first embodiment, the first holes H1 are formed from the lower surface of the glass substrate layer 10 to the middle portion of the glass substrate layer 10 in the thickness direction and the second holes H2 are formed from the upper surface of the glass substrate layer 10 to the middle portion of the glass substrate layer 10 in the thickness direction. The cross-sectional shape of the first hole H1 is an inverted tapered shape where the diameter of a lower portion (opening end) is larger than that of an upper portion (bottom). Further, the cross-sectional shape of the second hole H2 is a tapered shape where the diameter of an upper portion (opening end) is larger than that of a lower portion (bottom).

The first and second holes H1 and H2 communicate with each other at the middle portion of the glass substrate layer 10 in the thickness direction. In this way, the first and second holes H1 and H2 are disposed symmetrically to each other in the thickness direction of the glass substrate layer 10, so that through holes TH passing through the glass substrate layer 10 are formed.

In addition, the first wiring layer 20 is formed on the lower surface of the glass substrate layer 10 from the first holes H1 so as to fill the first holes H1. Further, the connection pads P are formed on the upper surface of the glass substrate layer 10 from the second holes H2 so as to fill the second holes H2. The first wiring layer 20 and the connection pads P form the through electrodes TE that pass through the glass substrate layer 10.

As described above, in the first embodiment, the first and second holes H1 and H2 are formed from both surfaces of the glass substrate layer 10, respectively, so that the through holes TH are obtained.

When through holes having a diameter of 50 μm and a depth of 200 μm are formed from one surface of the glass substrate layer 10 unlike this embodiment, an aspect ratio is large, that is, 4 (depth/diameter). Accordingly, it is not easy to form the through holes, so that there is a concern about the reduction in production yield.

Moreover, when the aspect ratio of the through hole is large, voids are formed when the through hole is to be filled with the metal plating layer in the above-mentioned semi-additive method. For this reason, yield is apt to deteriorate.

However, in this embodiment, the first and second holes H1 and H2 having a diameter of 50 μm are formed from both surfaces of the glass substrate layer 10 with a depth of 100 μm, and the through holes TH are formed by making the first and second holes H1 and H2 communicate with each other. For this reason, since the aspect ratio (depth/diameter) of each of the first and second holes H1 and H2 is small, that is, 2 (depth/diameter), it is easy to form the through holes. Accordingly, it is possible to improve production yield.

In addition, even when the first and second holes H1 and H2 are to be filled with the metal plating layer, the formation of voids or the like is avoided since the aspect ratio is small. Accordingly, it is possible to reliably form the wiring layer or the connection pads.

It is preferable that the first and second holes H1 and H2 be connected to each other at the middle position of the glass substrate layer 10 in the thickness direction. In this case, the aspect ratios of the first and second holes H1 and H2 are reduced. For this reason, since the formation of voids is prevented when the first and second holes H1 and H2 are to be filled with the metal plating layer, it is preferable that the first and second holes H1 and H2 be connected to each other at the middle position of the glass substrate layer 10 in the thickness direction.

However, there is no problem even though the first and second holes H1 and H2 are connected to each other while being vertically shifted from the middle position of the glass substrate layer 10 in the thickness direction by a distance corresponding to about ±20% of the thickness of the glass substrate layer 10.

Further, when the bottom of one hole of the first and second holes H1 and H2 and the bottom of the other hole thereof are connected to each other, there is no problem even though the center of the bottom of the other hole is horizontally shifted from the center of the bottom of one hole by a distance corresponding to about ±20% of the diameter of one hole.

The same applies to the case where a silicon substrate layer is used instead of the glass substrate layer 10 as in a second embodiment to be described below.

The first interlayer insulation layer 30 in which the first via holes VH1 reaching the first wiring layer 20 are formed is formed beneath the first wiring layer 20 that is formed on the lower surface of the glass substrate layer 10. Further, the second wiring layer 22, which is connected to the first wiring layer 20 through the first via holes VH1 (via conductors), is formed beneath the first interlayer insulation layer 30.

Likewise, the second interlayer insulation layer 32 in which the second via holes VH2 reaching the second wiring layer 22 are formed is formed beneath the second wiring layer 22. Furthermore, the third wiring layer 24, which is connected to the second wiring layer 22 through the second via holes VH2 (via conductors), is formed beneath the second interlayer insulation layer 32.

Likewise, the third interlayer insulation layer 34 in which the third via holes VH3 reaching the third wiring layer 24 are formed is formed beneath the third wiring layer 24. Moreover, the fourth wiring layer 26, which is connected to the third wiring layer 24 through the third via holes VH3 (via conductors), is formed beneath the third interlayer insulation layer 34. In addition, the solder resist 36, where the opening portions 36a are formed on the connection portions of the third wiring layer 24, is formed beneath the third interlayer insulation layer 34.

The connection pads P and the respective wiring layers 20, 22, 24, and 26 include portions that fill the holes H1 and H2 or the via holes VH1 to VH3, and wiring pattern portions that are formed on the glass substrate layer 10 or the interlayer insulation layers 30, 32, and 34, respectively.

In an example of FIG. 5, three build-up wiring layers connected to the first wiring layer 20 are laminated beneath the glass substrate layer 10. However, the number of build-up wiring layers, which are connected to the first wiring layer 20, may be arbitrarily set to n (n is an integer of 1 or more).

Figure 6:
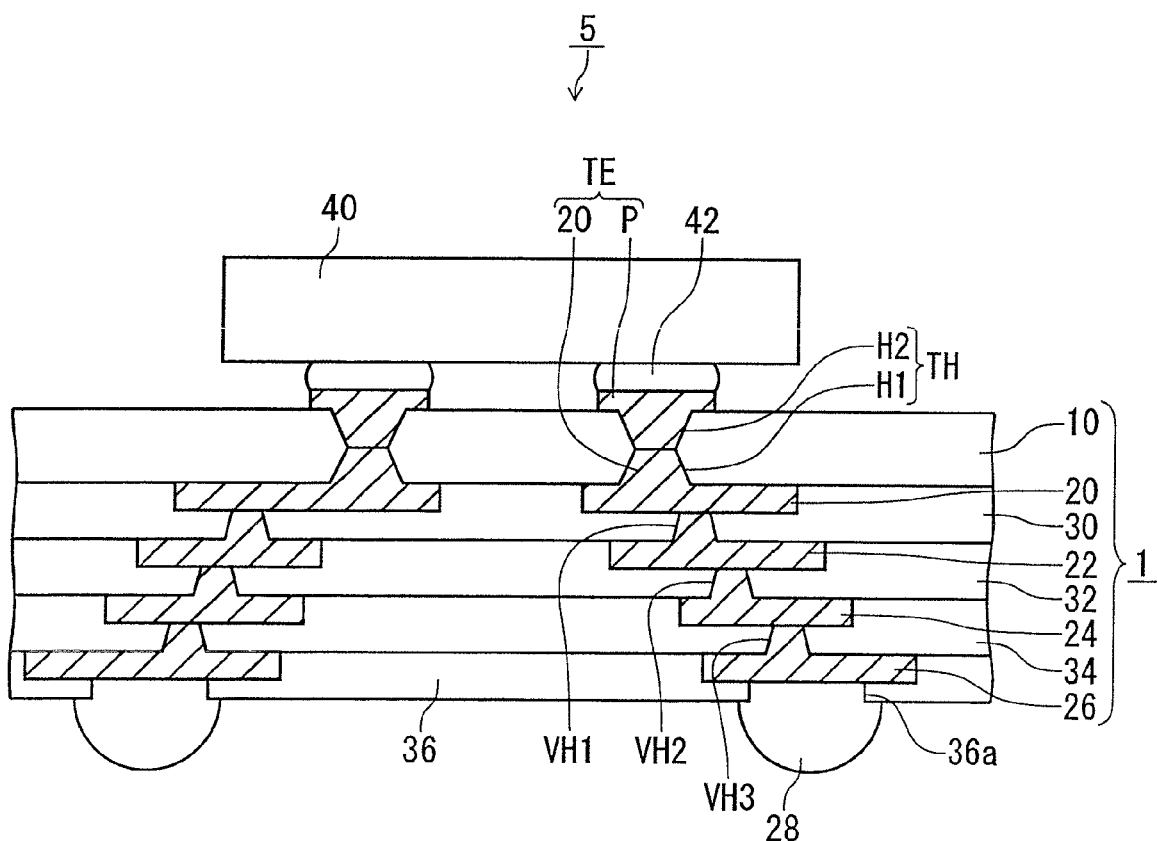
FIG. 6 is a cross-sectional view of a semiconductor device according to the first embodiment.

Next, a method of flip-chip connecting a semiconductor chip to the wiring substrate 1 according to this embodiment will be described. As shown in FIG. 6, solder bumps 42 of a semiconductor chip 40 are disposed on the connection pads P of the wiring substrate 1 of FIG. 5 and are subjected to reflow heating.

Accordingly, the solder bumps 42 of the semiconductor chip 40 are flip-chip connected to the connection pads P of the wiring substrate 1. In addition, external connection terminals 28 such as solder balls are formed on the fourth wiring layer 26. A gap between the semiconductor chip 40 and the wiring substrate 1 may be filled with an underfill resin.

As a result, a semiconductor device 5 according to the first embodiment is obtained.

In this case, the mounting surface of the wiring substrate 1 on which the semiconductor chip 40 is to be mounted is formed of the glass substrate layer 10 of which the coefficient of thermal expansion is similar to the coefficient of thermal expansion of the semiconductor chip (silicon), and the connection pads P are formed on the glass substrate layer 10.

The coefficient of thermal expansion of each of the glass substrate layer 10 and the semiconductor chip 40 is in the range of 3 to 6 ppm/° C. Further, the coefficient of thermal expansion of the glass substrate layer 10 is in the range of about ±30% of the coefficient of thermal expansion of the semiconductor chip 40.

For this reason, a problem that the wiring substrate 1 expands or warps more than the semiconductor chip 40 due to the heating performed for the flip-chip connection of the semiconductor chip 40 is solved.

Accordingly, even if the pitch of the solder bumps 42 of the semiconductor chip 40 is reduced to 100 μm or less, it is possible to accurately dispose the solder bumps 42 of the semiconductor chip 40 on the connection pads P of the wiring substrate 1.

Further, as described above, the through holes TH of the glass substrate layer 10 are obtained by making the first and second holes H1 and H2, which are formed from both surfaces of the glass substrate layer 10, communicate with each other. The diameter of the through hole TH is set to about 50 μm and the depth of the through hole TH is set in the range of about 100 to 300 μm.

For this reason, it is possible to make the diameter and length of the through electrode TE be smaller than those of the through electrode TE (diameter: 200 μm, length: 400 to 800 μm) that is formed in the core substrate 120 of the wiring substrate 100 described in the preliminary content.

Accordingly, since signals are not easily reflected by the through electrodes TE on high-frequency signal transmission lines of the wiring substrate 1 the degradation of high-frequency characteristics is prevented.

Moreover, since the glass substrate layer 10 having high rigidity is used as a substrate, it is possible to prevent the occurrence of warpage of the wiring substrate 1 even though thermal stress is generated in the wiring substrate 1.

Further, since it is possible to reduce the thickness of the glass substrate layer 10, which functions as a substrate, to the range of 100 to 300 μm, it is possible to make the entire wiring substrate 1 be thinner than the wiring substrate 100 of the preliminary content.

Figure 7:
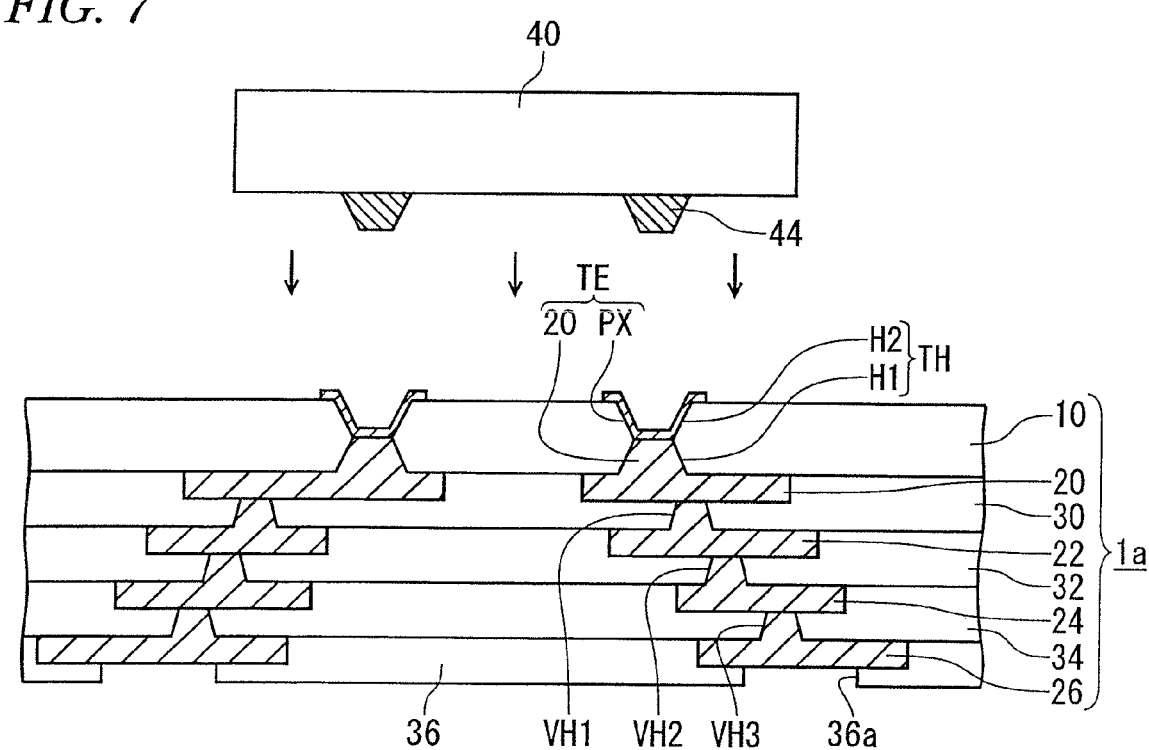
FIG. 7 is a cross-sectional view of a wiring substrate according to a modification of the first embodiment.

A wiring substrate 1a according to a modification of the first embodiment is shown in FIG. 7. As shown in FIG. 7, when connection pads are formed in second holes H2 of a glass substrate layer 10, concave connection pads PX may be formed on the inner surfaces of the second holes H2 so that the second holes H2 are not filled and holes remain in the second holes H2. The concave connection pads PX are made of copper (Cu) or gold (Au).

In a method of forming the concave connection pads PX, first, a thin metal layer made of copper or gold is formed on the upper surface of the glass substrate layer 10 and the inner surfaces of the second holes H2 by a sputtering method or the like. After that, the metal layer is patterned by photolithography and etching so that the concave connection pads PX remain on the inner surfaces of the second holes H2. Accordingly, the concave connection pads PX where the metal layer is formed along the inner surfaces of the second holes H2 are obtained.

Alternatively, the concave connection pads PX may be formed by a semi-additive method or electroless plating.

In the wiring substrate 1a according to the modification, a first wiring layer 20 and the concave connection pads PX form through electrodes TE.

When the wiring substrate 1a according to the modification is employed, a semiconductor chip 40 including metal bumps 44 made of copper (Cu) or gold (Au) is used.

Figure 8:
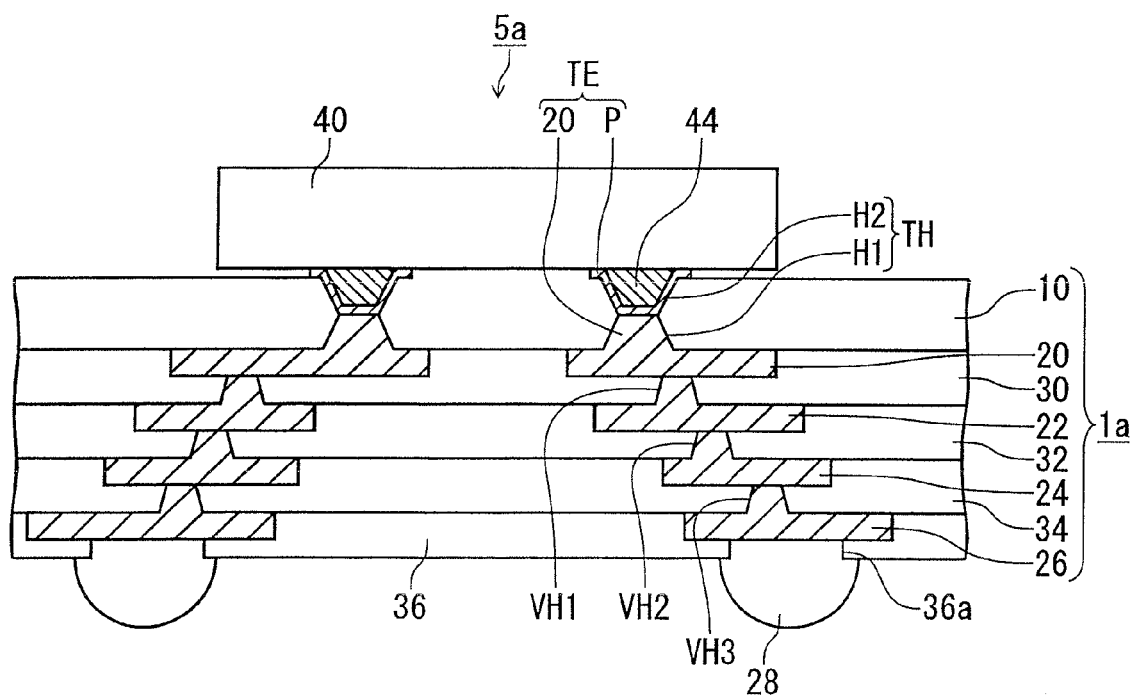
FIG. 8 is a cross-sectional view of a semiconductor device according to the modification of the first embodiment.

Further, as shown in FIG. 8, the metal bumps 44 of the semiconductor chip 40 are fitted and connected to the concave connection pads PX of the wiring substrate 1a. The metal bumps 44 of the semiconductor chip 40 and the concave connection pads PX of the wiring substrate 1a are electrically connected to each other by copper-copper or gold-gold metal bonding. Furthermore, external connection terminals 28 are formed by mounting solder balls on the fourth wiring layer 26.

As a result, a semiconductor device 5a according to the modification of the first embodiment is obtained.

Second Embodiment

Figure 12A:
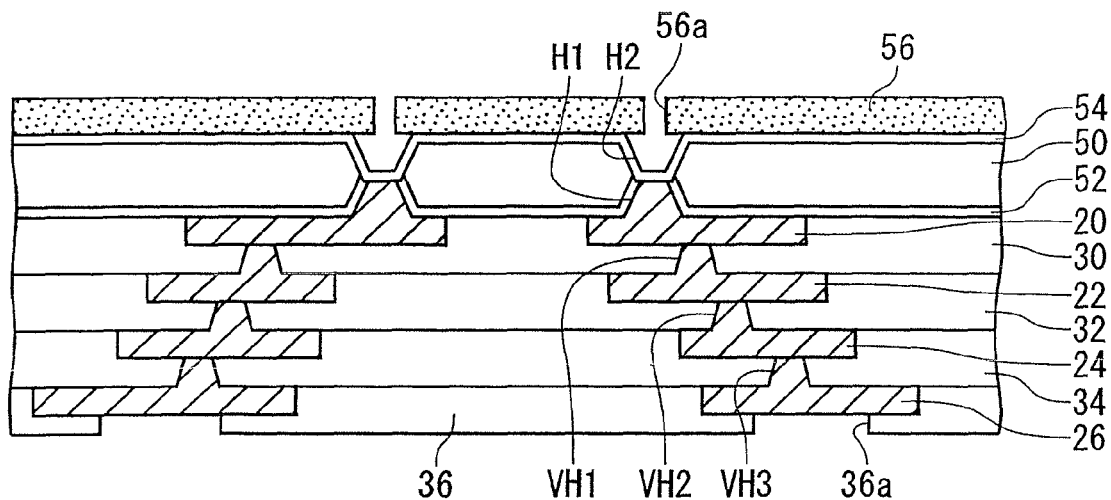
FIGS. 12A and 12B are (fourth) cross-sectional views illustrating the method of manufacturing the wiring substrate according to the second embodiment.
Figure 12B:
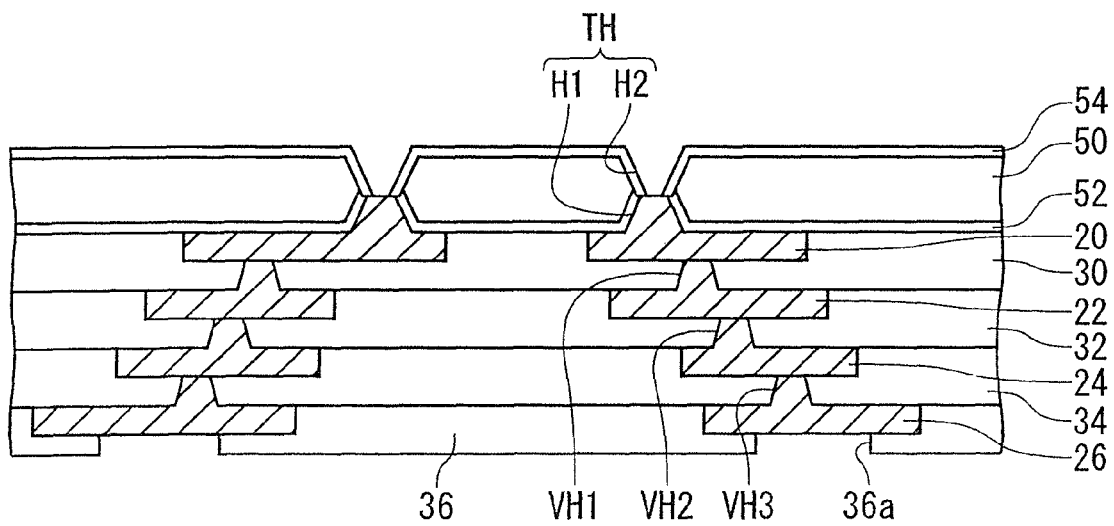
Figure 13:
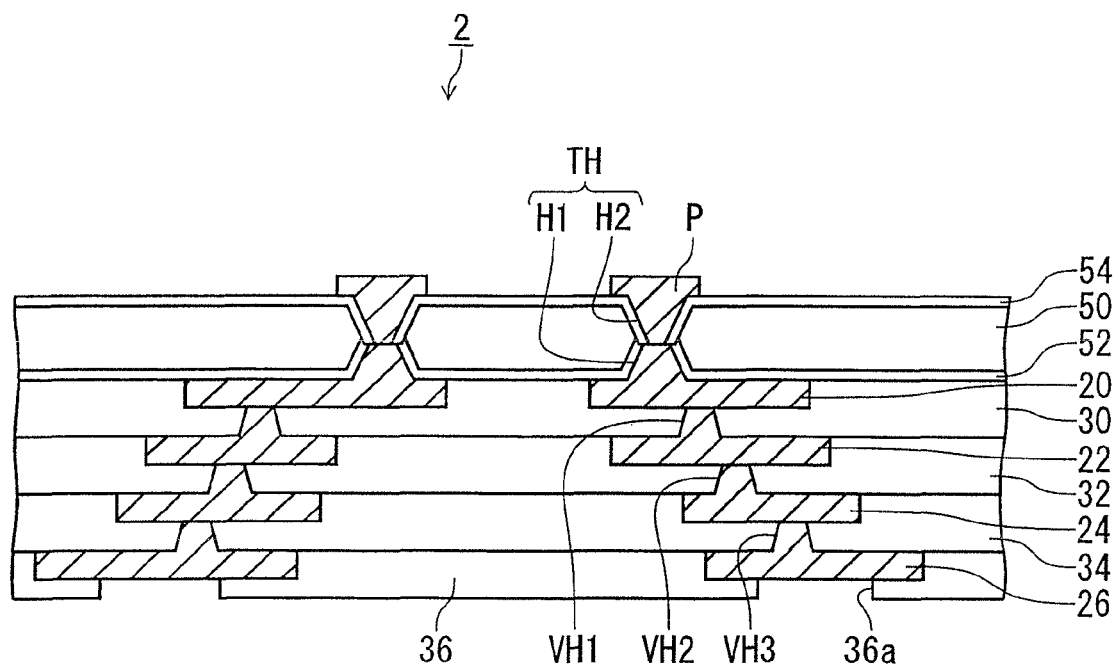
FIG. 13 is a cross-sectional view of the wiring substrate according to the second embodiment.

FIGS. 9 to 12 are cross-sectional views illustrating a method of manufacturing a wiring substrate according to a second embodiment, and FIG. 13 is a cross-sectional view of the wiring substrate according to the second embodiment.

The second embodiment is characterized in that a silicon substrate is used instead of the glass substrate of the first embodiment. The detailed description of the same steps and elements as those of the first embodiment will be omitted in the second embodiment.

Figure 9A:
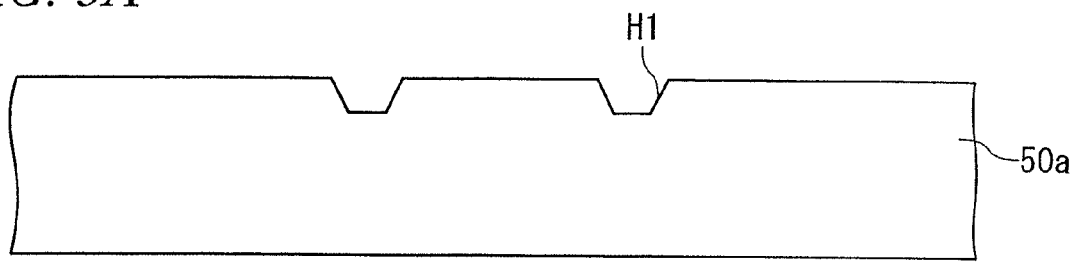
FIGS. 9A to 9C are (first) cross-sectional views illustrating a method of manufacturing a wiring substrate according to a second embodiment.

In the method of manufacturing the wiring substrate according to the second embodiment, a silicon substrate 50a having a thickness of 0.3 to 1 mm is prepared first as shown in FIG. 9A and first holes H1 are formed from the upper surface of the silicon substrate 50a by the same method as the method, which is used in the first embodiment, so as not to pass through the silicon substrate 50a.

Figure 9B:
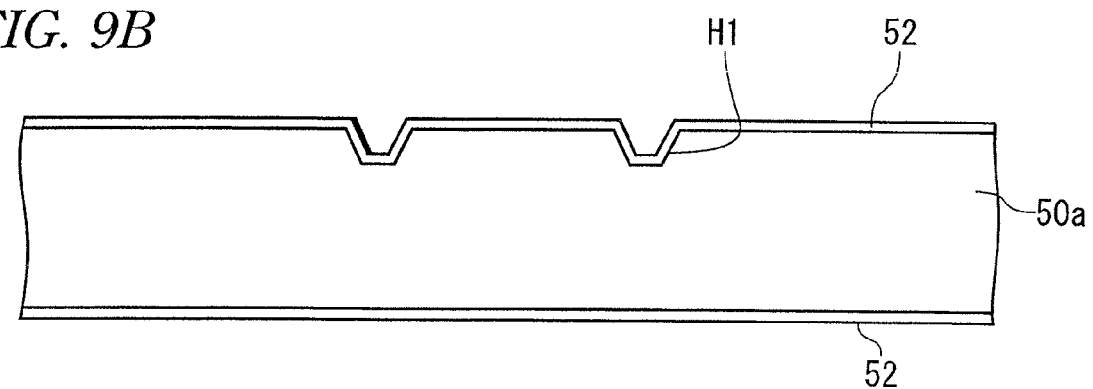

Then, an insulation layer 52 formed of a silicon oxide layer is formed on both surfaces of the silicon substrate 50a and the inner surfaces of the first holes H1 as shown in FIG. 9B by thermally oxidizing the silicon substrate 50a. Alternatively, a silicon oxide layer or silicon nitride layer may be formed on the surface of the silicon substrate 50a, on which the first holes H1 are formed, by a CVD method and may be used as the insulation layer 52.

Figure 9C:
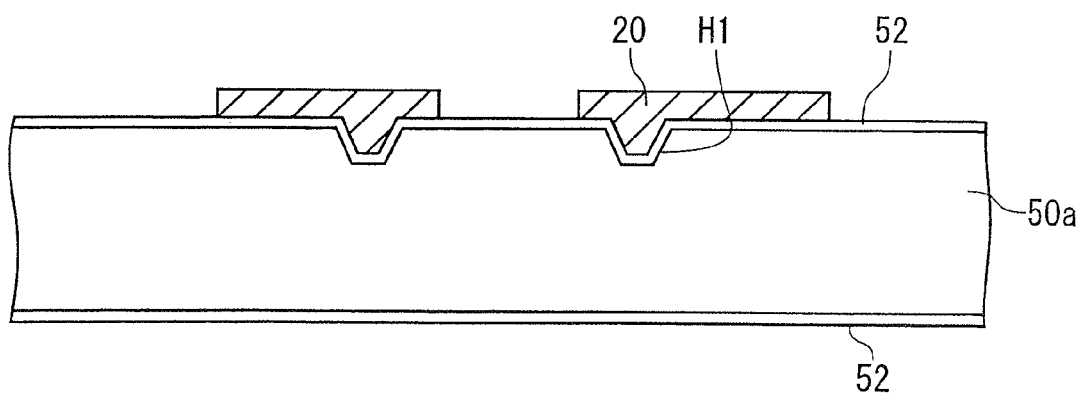

Next, as shown in FIG. 9C, a first wiring layer 20 is formed on portions of the insulation layer 52, which include the first holes H1 of the silicon substrate 50a, by the same method as the method used in the first embodiment. The first wiring layer 20 is formed so as to fill the first holes H1.

Figure 10A:
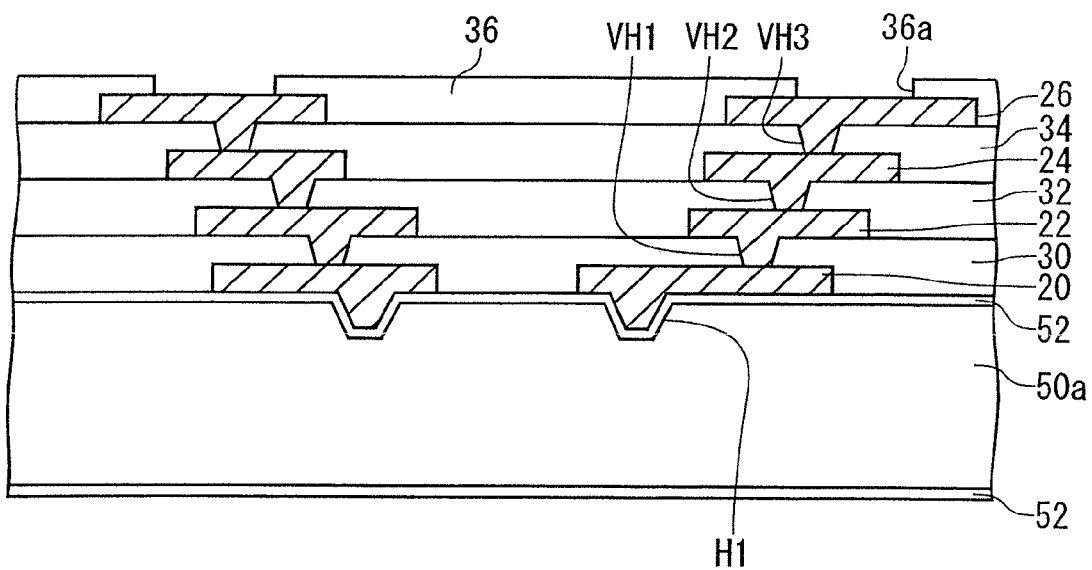
FIGS. 10A and 10B are (second) cross-sectional views illustrating the method of manufacturing the wiring substrate according to the second embodiment.

Subsequently, as shown in FIG. 10A, three build-up wiring layers (second, third, and fourth wiring layers 22, 24, and 26) connected to the first wiring layer 20 are formed by performing the same steps as the steps of FIGS. 3A to 3C of the first embodiment.

Figure 10B:
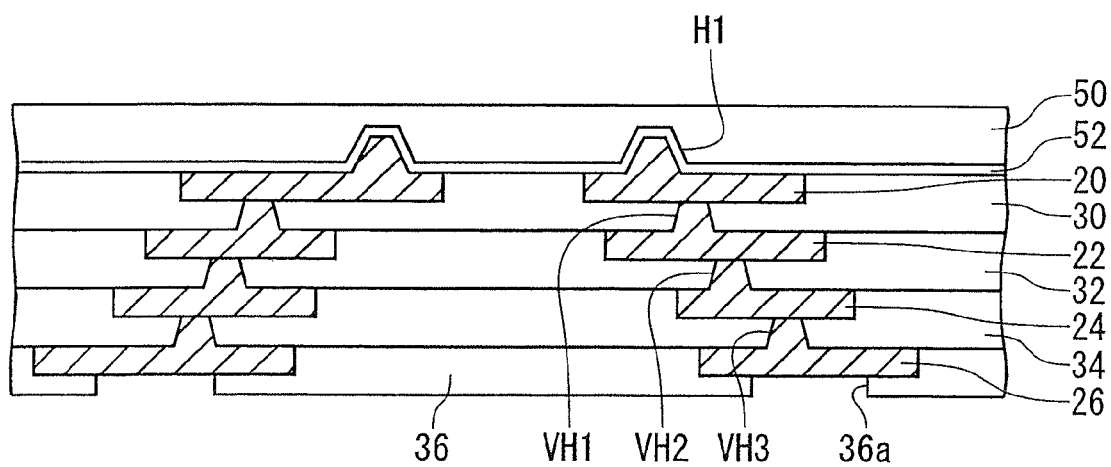

Subsequently, as shown in FIG. 10B, a structure shown in FIG. 10A is turned over and the thickness of the entire silicon substrate 50a is reduced by machining that is performed on the insulation layer 52 and the silicon substrate 50a in the thickness direction. Accordingly, a silicon substrate layer 50 of which the thickness is reduced to the range of about 100 to 300 μm is obtained. At this time, as in the first embodiment, the silicon substrate 50a is subjected to machining so that the silicon substrate layer 50 remains on the first wiring layer 20.

Figure 11A:
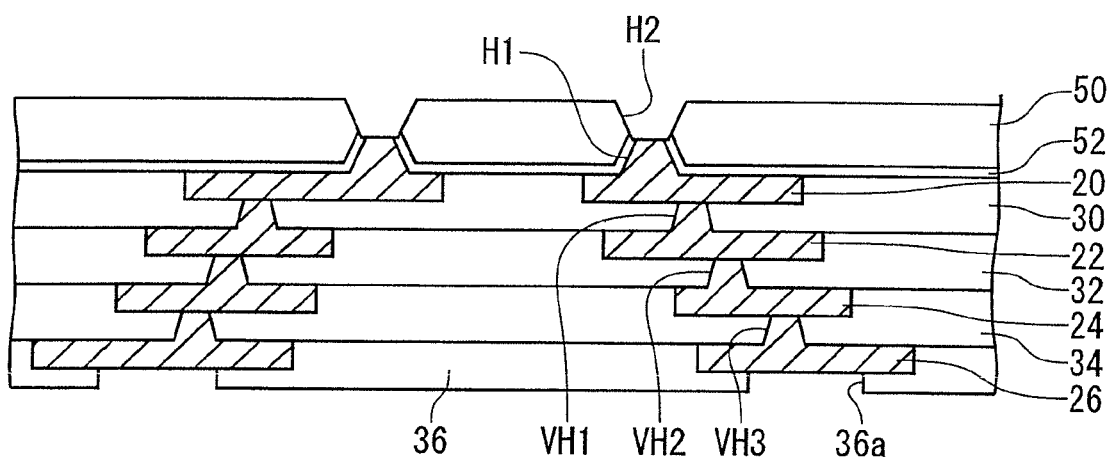
FIGS. 11A and 11B are (third) cross-sectional views illustrating the method of manufacturing the wiring substrate according to the second embodiment.

After that, as shown in FIG. 11A, second holes H2 reaching the first wiring layer 20 are formed by machining that is performed on portions of the silicon substrate layer 50 and the insulation layer 52 formed on the first holes H1.

Figure 11B:
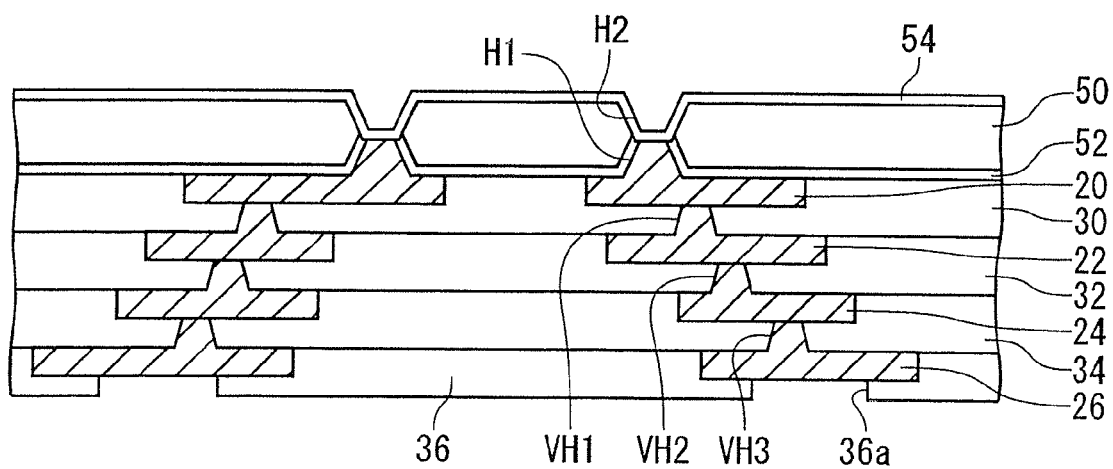

Moreover, as shown in FIG. 11B, an insulation layer 54 is obtained by forming a silicon oxide layer or a silicon nitride layer on the upper surface of the silicon substrate layer 50 and the inner surfaces of the second holes H2 by a CVD method.

Next, as shown in FIG. 12A, a resist 56 in which opening portions 56a are formed at the portions corresponding to the second holes H2 is patterned by photolithography. For example, a dry film resist is attached to the insulation layer and exposure and development are performed, so that the resist 56 including the opening portions 56a is obtained. In addition, the insulation layer 54, which is formed at the bottoms of the second holes H2, is etched and removed by anisotropic dry etching that is performed through the opening portions 56a of the resist 56. After that, the resist 56 is removed.

As a result, as shown in FIG. 12B, the insulation layer 54 remains on the upper surface of the silicon substrate layer 50 and the side walls of the second holes H2 and the first wiring layer 20 is exposed to the bottoms of the second holes H2.

In this way, the through holes TH passing through the silicon substrate layer 50 are obtained from the first and second holes H1 and H2.

Meanwhile, besides the method of patterning the insulation layer 54 by photolithography and etching, the insulation layer 54 may be formed of a photosensitive insulating resin layer. In this case, a liquid or paste photosensitive insulating resin is applied on the silicon substrate layer 50 of FIG. 11A. Then, the insulating resin applied on the bottoms of the second holes H2 is removed by exposure and development, and the photosensitive insulating resin is cured by heating. Accordingly, likewise, it is possible to form the insulation layer 54 so that the first wiring layer 20 is exposed to the bottoms of the second holes H2.

A phenol photosensitive resin, a polyimide photosensitive resin, a polybenzoxazole photosensitive resin, and the like may be used as the photosensitive insulating resin.

The thickness of the insulation layer 54 depends on the diameter or depth of the second hole H2, but is set in the range of, for example, 2 to 50 μm.

Subsequently, as shown in FIG. 13, as in the first embodiment, connection pads P electrically connected to the first wiring layer 20 are formed on portions of the insulation layer 54 that include the second holes H2 of the silicon substrate layer 50. The connection pads P are formed so as to fill the second holes H2.

As a result, a wiring substrate 2 according to the second embodiment is obtained.

As shown in FIG. 13, in the wiring substrate 2 according to the second embodiment, the silicon substrate layer 50 is used instead of the glass substrate layer 10 of the wiring substrate 1 according to the first embodiment.

Further, as in the first embodiment, through holes TH are formed by making the first and second holes H1 and H2, which are formed from both surfaces of the silicon substrate layer 50, communicate with each other. The insulation layers 52 and 54 are formed on both surfaces of the silicon substrate layer 50 and the inner surfaces of the through holes TH.

Furthermore, the first wiring layer 20 is formed on the insulation layer 52 of the lower surface of the silicon substrate layer 50 from the first holes H1 so as to fill the first holes H1. Moreover, the connection pads P connected to the first wiring layer 20 are formed on the insulation layer 54 of the upper surface of the silicon substrate layer 50 from the second holes H2 so as to fill the second holes H2.

The first wiring layer 20 and the connection pads P form the through electrodes TE that pass through the silicon substrate layer 50. In addition, as in the first embodiment, three build-up wiring layers (second, third, and fourth wiring layers 22, 24, and 26) connected to the first wiring layer 20 are formed under the silicon substrate layer 50.

The wiring substrate 2 according to the second embodiment has the same advantages as the advantages of the wiring substrate according to the first embodiment.

Figure 14:
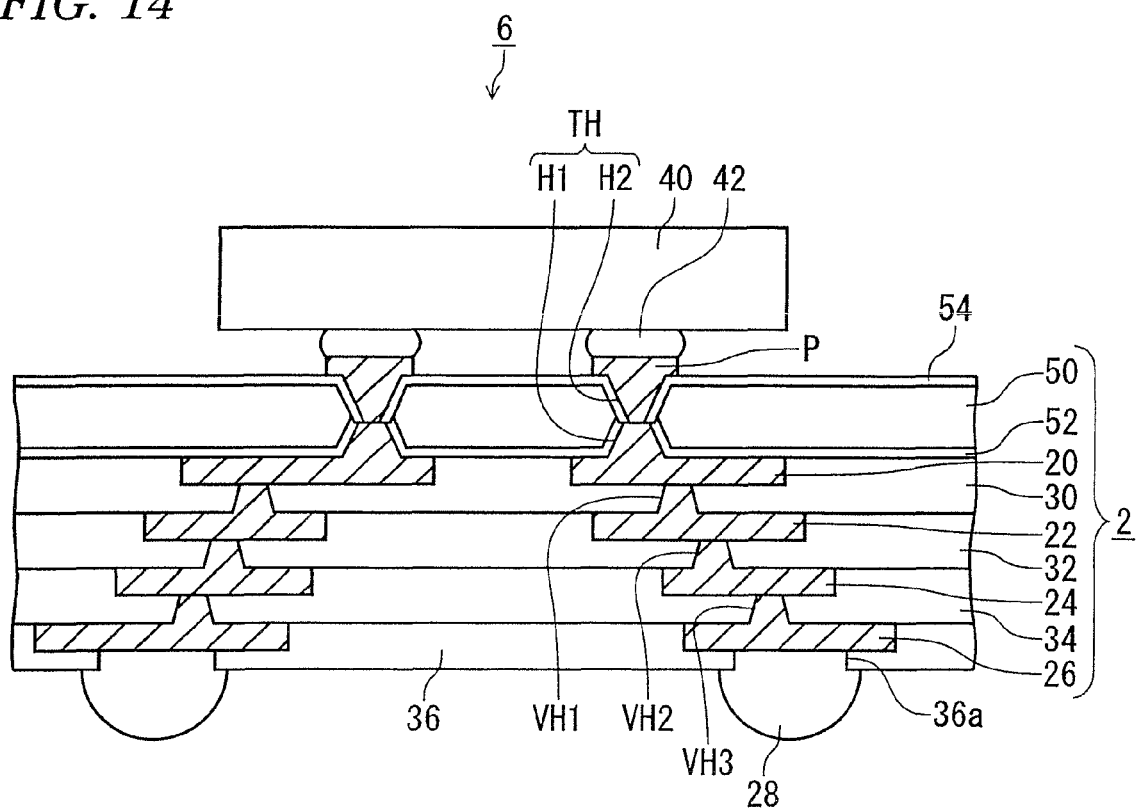
FIG. 14 is a cross-sectional view of a semiconductor device according to the second embodiment.

Further, as shown in FIG. 14, as in the first embodiment, solder bumps 42 of a semiconductor chip 40 are flip-chip connected to the connection pads P of the wiring substrate 2 by reflow heating. Furthermore, external connection terminals 28 are formed by mounting solder balls on the fourth wiring layer 26.

As a result, a semiconductor device 6 according to the second embodiment is obtained.

In this case, the mounting surface of the wiring substrate 2 on which the semiconductor chip 40 is to be mounted is formed of the silicon substrate layer 50 of which the coefficient of thermal expansion is the same as the coefficient of thermal expansion of the semiconductor chip 40 (silicon), and the connection pads P are formed on the silicon substrate layer 50.

The coefficient of thermal expansion of each of the silicon substrate layer 50 and the semiconductor chip 40 is in the range of 3 to 6 ppm/° C. Further, the coefficient of thermal expansion of the silicon substrate layer 50 is in the range of about ±30% of the coefficient of thermal expansion of the semiconductor chip 40.

For this reason, a problem that the wiring substrate 2 expands or warps more than the semiconductor chip 40 due to the heating performed for the flip-chip connection of the semiconductor chip 40 is solved.

Accordingly, even if the pitch of the solder bumps 42 of the semiconductor chip 40 is reduced to 100 μm or less, it is possible to accurately dispose the solder bumps 42 of the semiconductor chip 40 on the connection pads P of the wiring substrate 2.

Further, as in the case where the glass substrate layer 10 of the first embodiment is used, it is possible to form the connection pads P having a small pitch by a semi-additive method since the surface of the silicon substrate layer 50 is smoother than the surface of the insulation layer made of a resin.

Furthermore, since it is possible to make the diameter and length of the through electrode TE, which is formed in the silicon substrate layer 50, be small as in the case where the glass substrate layer 10 of the first embodiment is used, the degradation of high-frequency characteristics is prevented.

Even in the wiring substrate 2 according to the second embodiment, concave connection pads may be formed on the inner surfaces of the second holes H2 and the metal bumps of the semiconductor chip may be fitted to the concave connection pads as in the wiring substrate 1a according to the modification of the first embodiment.

Third Embodiment

Figure 16A:
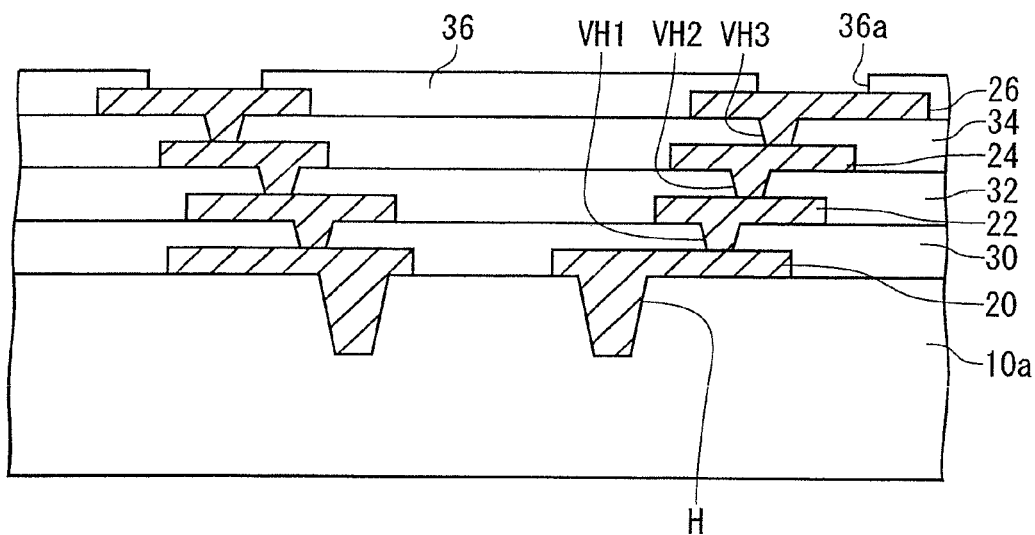
FIGS. 16A and 16B are (second) cross-sectional views illustrating the method of manufacturing the wiring substrate according to the third embodiment.
Figure 16B:
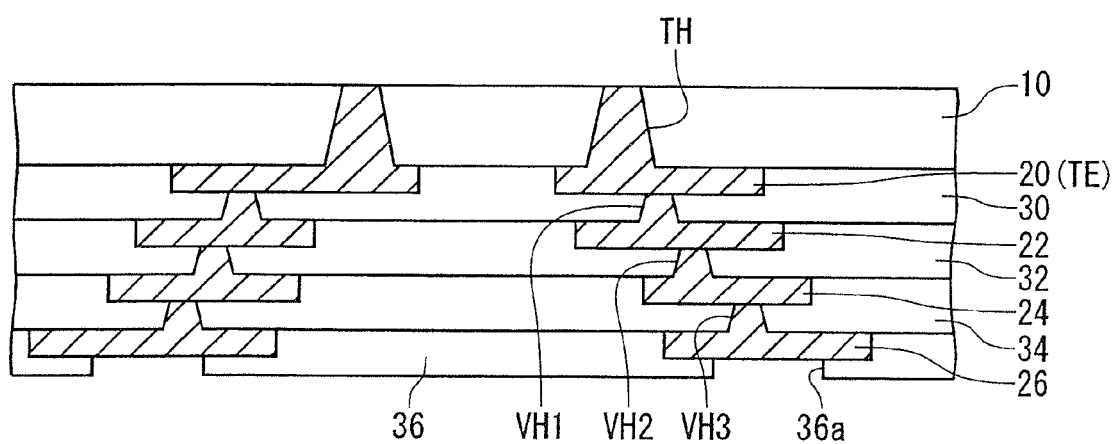
Figure 17:
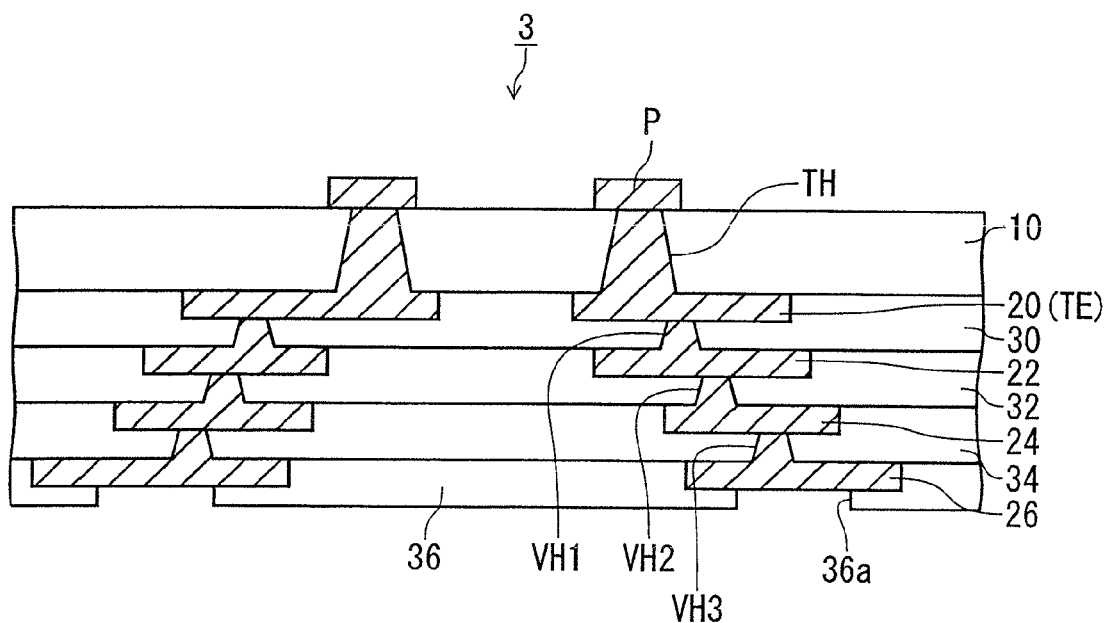
FIG. 17 is a cross-sectional view of the wiring substrate according to the third embodiment.

FIGS. 15 and 16 are cross-sectional views illustrating a method of manufacturing a wiring substrate according to a third embodiment, and FIG. 17 is a cross-sectional view of the wiring substrate according to the third embodiment.

In the first and second embodiments, the first and second holes are formed from both surfaces of the glass substrate layer and the silicon substrate layer, and the through holes are formed by making the first and second holes communicate with each other. Accordingly, the formation of the holes and filling the holes with the metal plating layer are facilitated by the reduction of the aspect ratio of each of the holes.

A case where holes are formed from only one surface of a substrate layer to form through holes for the reduction in cost when through holes formed in a glass substrate layer or a silicon substrate layer have a relatively large diameter will be described in the third embodiment.

The detailed description of the same steps and elements as those of the first embodiment will be omitted in the third embodiment.

Figure 15A:
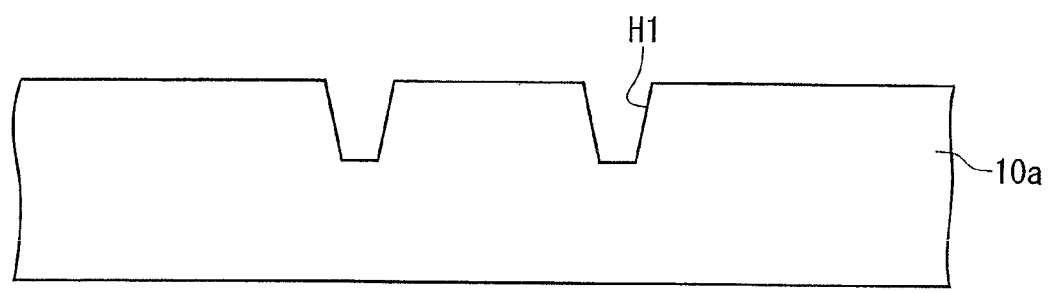
FIGS. 15A and 15B are (first) cross-sectional views illustrating a method of manufacturing a wiring substrate according to a third embodiment.

In the method of manufacturing the wiring substrate according to the third embodiment, a glass substrate 10a is prepared first as shown in FIG. 15A as in the first embodiment, and holes H are formed from the upper surface of the glass substrate 10a by machining so as not to pass through the glass substrate 10a.

In the third embodiment, the diameter of each of the through holes, which are finally formed in a glass substrate layer, is about 100 μm and is set to be considerably larger than the diameter (50 μm) of each of the through holes of the glass substrate layer and the silicon substrate layer of the first and second embodiments. The diameter of the through holes means the diameter of an end of through hole that is opened to the surface of the glass substrate 10a.

Accordingly, if the diameter of the hole H is set to 100 μm and the depth of the hole H is set to 200 μm, the aspect ratio (depth/diameter) of the hole H becomes 2. Accordingly, even though the holes H are formed from only one surface of the glass substrate 10a, the formation of the holes H is facilitated.

The cross-sectional shape of the hole H is set to a tapered shape where the diameter of an upper portion is larger than that of a bottom.

Figure 15B:
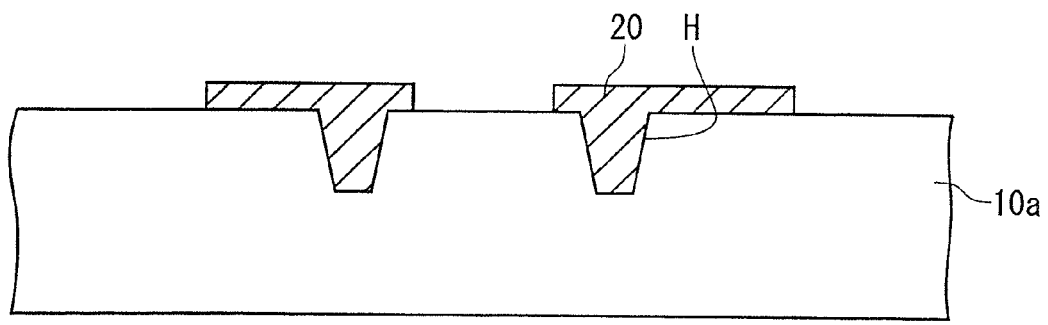

After that, as shown in FIG. 15B, as in the first embodiment, a first wiring layer 20 is formed on portions of the glass substrate 10a including the holes H so as to fill the holes H.

Subsequently, as shown in FIG. 16A, three build-up wiring layers (second, third, and fourth wiring layers 22, 24, and 26) connected to the first wiring layer 20 are formed by performing the same steps as the steps of FIGS. 3A to 3C of the first embodiment.

After that, as shown in FIG. 16B, a structure shown in FIG. 16A is turned over and the glass substrate 10a is made thin by machining that is performed on the exposed surface of the glass substrate 10a until the first wiring layer 20 formed at the bottoms of the holes H is exposed to the outside. Accordingly, a thin glass substrate layer 10 is obtained and the first wiring layer 20 is exposed to the upper surface of the glass substrate layer 10. Further, the holes H are changed into through holes TH passing through the glass substrate layer 10, and the first wiring layer 20 functions as through electrodes TE that fill the through holes TH.

After that, as shown in FIG. 17, connection pads P electrically connected to the first wiring layer 20 are formed on the upper surface of the glass substrate layer 10 from the upper portions of the holes H (first wiring layer 20).

As a result, a wiring substrate 3 according to the third embodiment is obtained.

As described above, in the third embodiment, first, the tapered holes H are formed from one surface of the glass substrate 10a by laser or the like so as not to pass through the glass substrate 10a. In addition, after the first wiring layer 20 is formed in the holes H, the glass substrate 10a is made thin by machining that is performed on the other surface of the glass substrate 10a until the first wiring layer 20 is exposed to the outside. As a result, the through holes TH are obtained.

For this reason, in the wiring substrate 3 according to the third embodiment, the inverted tapered through holes TH each of which has the diameter of an upper portion smaller than that of a lower portion are formed in the glass substrate layer 10. The first wiring layer 20 is formed on the lower surface of the glass substrate layer 10 from the inside of the through holes TH so as to fill the through holes TH. Moreover, the connection pads P connected to the first wiring layer 20 are formed on the upper surface of the glass substrate layer 10.

Further, as in the first embodiment, three build-up wiring layers (second, third, and fourth wiring layers 22, 24, and 26) connected to the first wiring layer 20 are formed under the glass substrate layer 10.

Figure 18:
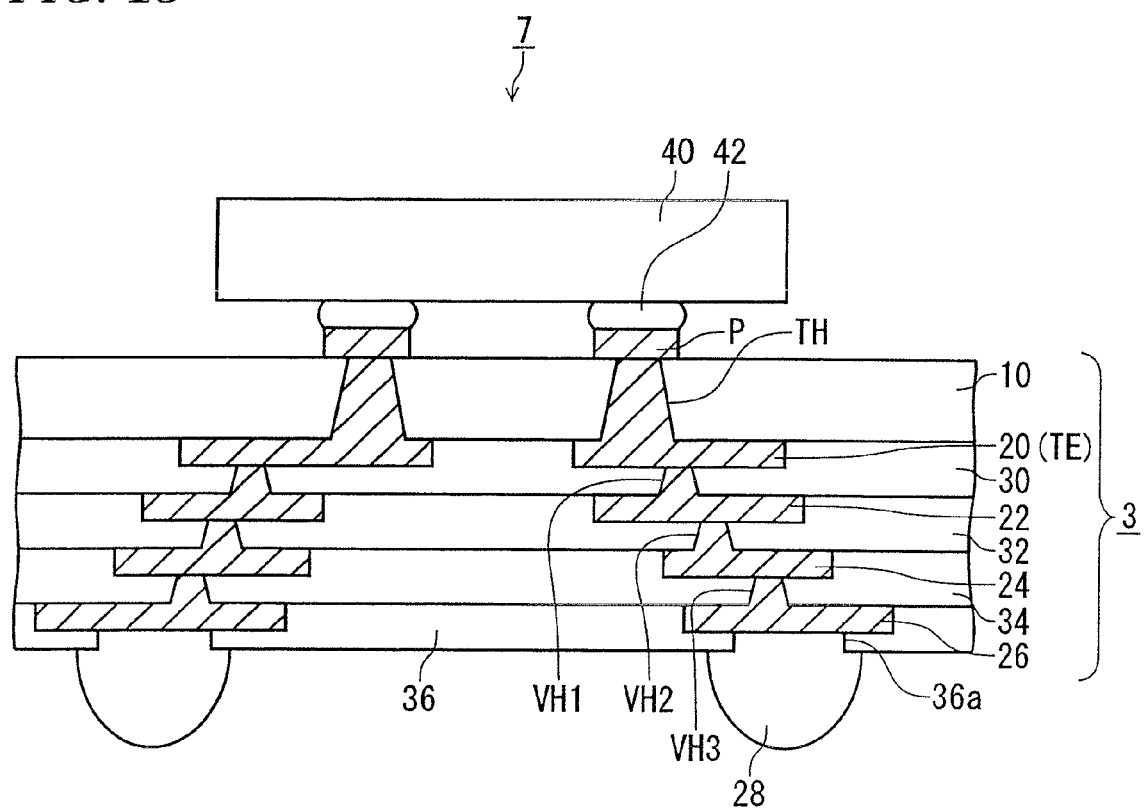
FIG. 18 is a cross-sectional view of a semiconductor device according to the third embodiment.

Furthermore, as shown in FIG. 18, as in the first embodiment, solder bumps 42 of a semiconductor chip 40 are flip-chip connected to the connection pads P of the wiring substrate 3 by reflow heating. In addition, external connection terminals 28 are formed by mounting solder balls on the fourth wiring layer 26.

As a result, a semiconductor device 7 according to the third embodiment is obtained.

The wiring substrate 3 according to the third embodiment has the same advantages as the advantages of the wiring substrate according to the first embodiment. Moreover, the third embodiment is useful when the through holes TH having a relatively large diameter are formed in the glass substrate layer 10. In this case, since the number of steps is smaller than the number of steps of each of the first and second embodiments, it is possible to reduce cost.

Fourth Embodiment

Figure 19:
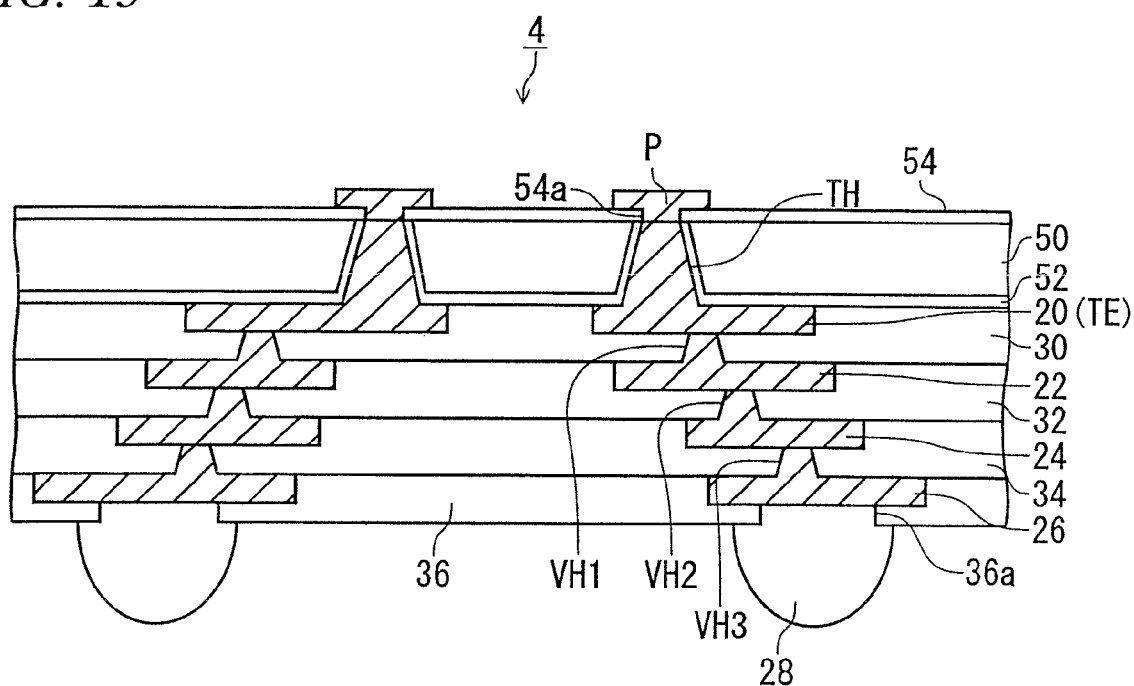
FIG. 19 is a cross-sectional view of a wiring substrate according to a fourth embodiment.

FIG. 19 is a cross-sectional view of a wiring substrate according to a fourth embodiment. The fourth embodiment is characterized such that a silicon substrate layer is used instead of the glass substrate layer of the third embodiment. The detailed description of the same steps and elements as those of the first embodiment will be omitted in the fourth embodiment.

As shown in FIG. 19, in a wiring substrate 4 according to the fourth embodiment, the glass substrate layer 10 of the wiring substrate 3 according to the third embodiment shown in FIG. 17 is substituted with a silicon substrate layer 50. Further, as in the third embodiment, inverted tapered through holes TH, each of which has the diameter of an upper portion smaller than that of a lower portion, are formed in the silicon substrate layer 50.

In the fourth embodiment, insulation layers 52 and 54 are formed on both surfaces of the silicon substrate layer 50 and the inner surfaces of the through holes TH. Further, opening portions 54a are formed in the insulation layer 54 on the first wiring layer 20 that are formed in the through holes TH. Connection pads P are connected to the first wiring layer 20 through the opening portions 54a of the insulation layer 54.

When the wiring substrate 4 according to the fourth embodiment is manufactured, a silicon substrate is used in the step of the third embodiment shown in FIG. 15A and holes H are formed. Then, the insulation layer 52 is formed on the upper surface of the silicon substrate and the inner surfaces of the holes H by thermal oxidation or a CVD method.

Moreover, after the step shown in FIG. 16B, the insulation layer 54 is formed on the upper surface of the silicon substrate layer 50 by a CVD method. The insulation layer 54 may be patterned to form the opening portions 54a on the first wiring layer 20.

Figure 20:
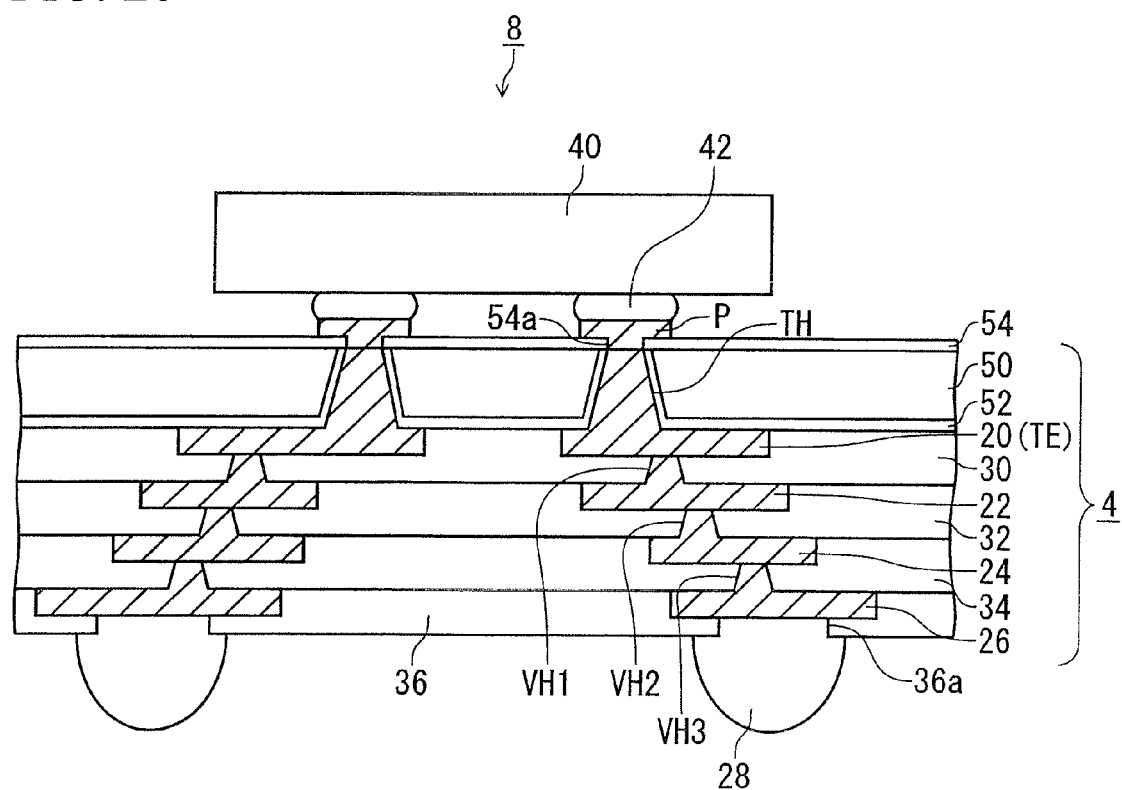
FIG. 20 is a cross-sectional view of a semiconductor device according to the fourth embodiment.

Further, as shown in FIG. 20, as in the first embodiment, solder bumps 42 of a semiconductor chip 40 are flip-chip connected to the connection pads P of the wiring substrate 4 by reflow heating. Furthermore, external connection terminals 28 are formed by mounting solder balls on the fourth wiring layer 26.

As a result, a semiconductor device 8 according to the fourth embodiment is obtained.

The wiring substrate 4 according to the fourth embodiment has the same advantages as the advantages of the wiring substrate according to the first embodiment. Moreover, like the third embodiment, the fourth embodiment is useful when the through holes TH having a relatively large diameter are formed in the silicon substrate layer 50. In this case, since the number of steps is smaller than the number of steps of each of the first and second embodiments, it is possible to reduce cost.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A wiring substrate comprising:
a substrate, a material of the substrate consisting of glass or silicon, the substrate having:
a first surface formed with a first hole; and
a second surface formed with a second hole and being opposite to the first surface, the first hole being communicated with the second hole, and the second surface of the substrate is a mounting surface on which a semiconductor chip is to be mounted;
a connection pad formed in the second hole;
a first wiring layer formed in the first hole and electrically connected to the connection pad;
a first insulation layer formed on the first surface of the substrate to cover the first wiring layer, the first insulting layer being made of a resin material;
a second wiring layer formed on the first insulation layer and electrically connected to the first wiring layer;
a plurality of insulation layers and a plurality of wiring layers being alternately arranged to form a stack on the first surface side of the substrate; and
a solder resist layer formed on a surface of the stack opposite to the substrate,
wherein a diameter of the first hole is gradually decreased from the first surface toward the second surface, and
a diameter of the second hole is gradually decreased from the second surface toward the first surface.

2. The wiring substrate of claim 1, wherein the substrate is made of glass.

3. The wiring substrate of claim 1, wherein the substrate is made of silicon.

4. The wiring substrate of claim 3, further comprising a silicon oxide layer covering the substrate,
wherein the first insulation layer is formed on the first surface of the substrate layer via the silicon oxide layer.

5. The wiring substrate of claim 1, wherein the connection pad is formed in the second hole to completely fill the second hole or is formed along a shape of the second hole.

6. A semiconductor device having a wiring substrate comprising:
a substrate layer, a material of the substrate layer consisting of glass or silicon, the substrate layer having:
a first surface formed with a first hole; and
a second surface formed with a second hole and being opposite to the first surface, the first hole being communicated with the second hole;
a connection pad formed in the second hole;
a first wiring layer formed in the first hole and electrically connected to the connection pad;
a first insulation layer formed on the first surface of the substrate layer to cover the first wiring layer, the first insulating later being made of a resin material;
a second wiring layer formed on the first insulation layer and electrically connected to the first wiring layer;
a plurality of insulation layers and a plurality of wiring layers being alternately arranged to form a stack on the first surface side of the substrate layer; and
a solder resist layer formed on a surface of the stack opposite the substrate layer,
wherein a diameter of the first hole is gradually decreased from the first surface toward the second surface, and a diameter of the second hole is gradually decreased from the second surface toward the first surface, and
a semiconductor chip mounted on the second surface of the substrate layer of the wiring substrate so as to be connected to the connection pad.

7. The wiring substrate of claim 1, wherein a contact surface of the first wiring layer which contacts the connection pad is roughened.

8. The semiconductor device of claim 6, wherein the semiconductor chip comprises a connection terminal thereon, and the semiconductor chip is mounted on the wiring substrate such that the connection terminal is connected to the connection pad.

* * * * *